(12) United States Patent
Nam et al.

(10) Patent No.: US 10,121,542 B2
(45) Date of Patent: Nov. 6, 2018

(54) NONVOLATILE MEMORY DEVICE, STORAGE DEVICE INCLUDING NONVOLATILE MEMORY DEVICE AND READING METHOD OF NONVOLATILE MEMORY DEVICE

(71) Applicant: SAMSUNG ELECTRONICS CO., LTD., Suwon-si, Gyeonggi-Do (KR)

(72) Inventors: Sang-Wan Nam, Hwaseong-si (KR); Daeseok Byeon, Seongnam-si (KR); Chiweon Yoon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/681,479

(22) Filed: Aug. 21, 2017

(65) Prior Publication Data

US 2018/0053554 A1 Feb. 22, 2018

(30) Foreign Application Priority Data

Aug. 22, 2016 (KR) .................... 10-2016-0106284

(51) Int. Cl.
| | |
|---|---|
| *G11C 16/04* | (2006.01) |
| *G11C 16/08* | (2006.01) |
| *G11C 16/10* | (2006.01) |
| *G11C 16/28* | (2006.01) |
| *G11C 16/26* | (2006.01) |
| *G11C 16/34* | (2006.01) |

(52) U.S. Cl.
CPC .......... *G11C 16/08* (2013.01); *G11C 16/0408* (2013.01); *G11C 16/0483* (2013.01); *G11C 16/107* (2013.01); *G11C 16/26* (2013.01); *G11C 16/28* (2013.01); *G11C 16/3459* (2013.01); *G11C 2216/16* (2013.01)

(58) Field of Classification Search
CPC . G11C 16/08; G11C 16/0408; G11C 16/0483; G11C 16/107; G11C 16/26; G11C 16/28; G11C 16/3459; G11C 2216/16
USPC .......................... 365/185.17, 185.03, 185.23
See application file for complete search history.

(56) References Cited

U.S. PATENT DOCUMENTS

| | | | |
|---|---|---|---|
| 7,505,322 B2 | 3/2009 | Lee | |
| 7,623,385 B2 | 11/2009 | Kim et al. | |
| 7,852,676 B2 | 12/2010 | Maejima | |
| 7,876,618 B2 | 1/2011 | Lee et al. | |
| 8,670,285 B2 | 3/2014 | Dong et al. | |
| 9,190,151 B2 | 11/2015 | Nam et al. | |
| 9,245,637 B2 | 1/2016 | Yang et al. | |
| 9,286,994 B1 | 3/2016 | Chen et al. | |
| 9,312,008 B2* | 4/2016 | Nam ................. | G11C 16/0483 |
| 9,620,232 B2* | 4/2017 | Nam ................. | G11C 16/0483 |
| 2015/0221373 A1* | 8/2015 | Nam ................. | G11C 16/0483 365/185.02 |
| 2016/0071602 A1 | 3/2016 | Shiino et al. | |
| 2016/0232981 A1* | 8/2016 | Nam ................. | G11C 16/0483 |

* cited by examiner

*Primary Examiner* — Gene Auduong
(74) *Attorney, Agent, or Firm* — Volentine, Whitt & Francos, PLLC

(57) ABSTRACT

A nonvolatile memory device includes a memory cell array and a row decoder circuit. The row decoder circuit turns on memory cells of a plurality of cell strings of a selected memory block after applying a first prepulse to a first dummy word line connected to first dummy memory cells after applying a second prepulse to a second dummy word line connected to second dummy memory cells.

20 Claims, 16 Drawing Sheets

FIG. 9
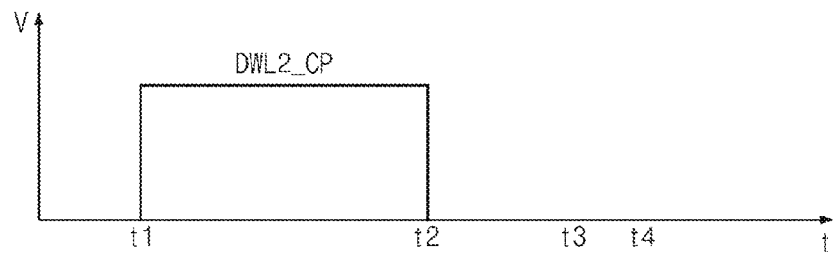
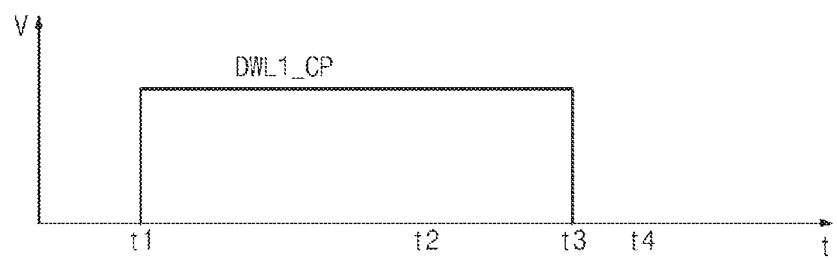
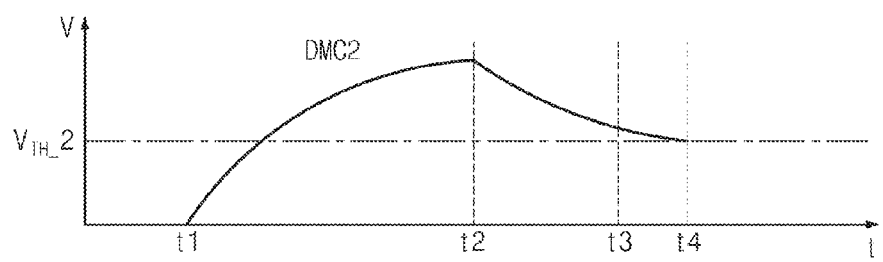
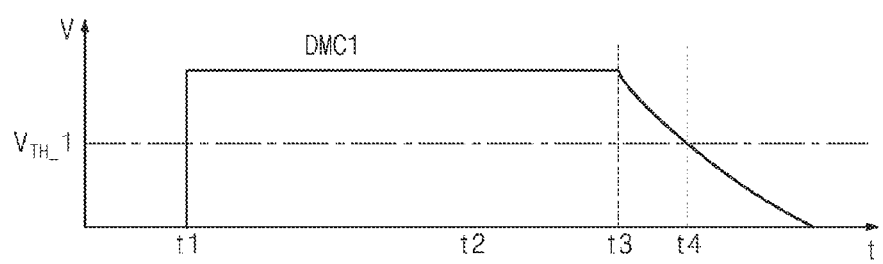

NONVOLATILE MEMORY DEVICE, STORAGE DEVICE INCLUDING NONVOLATILE MEMORY DEVICE AND READING METHOD OF NONVOLATILE MEMORY DEVICE

CROSS-REFERENCE TO RELATED APPLICATIONS

A claim for priority under 35 U.S.C. § 119 is made to Korean Patent Application No. 10-2016-0106284 filed Aug. 22, 2016, in the Korean Intellectual Property Office, the entire contents of which are hereby incorporated by reference.

BACKGROUND

Embodiments of the inventive concept described herein relate to a semiconductor memory, and in particular, to a nonvolatile memory device, a storage device including the nonvolatile memory device, and a reading method of the nonvolatile memory device.

A storage device refers to a device which stores data under control of a host device, such as a computer, a smartphone, and a smart pad. Storage devices includes devices which store data on a magnetic disk, such as a hard disk drive (HDD), and devices which store data in a semiconductor memory, in particular, a nonvolatile memory, such as a solid state drive (SSD) or a memory card.

A read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), and a ferroelectric RAM (FRAM) are all examples of different types of nonvolatile memory.

The degree of integration of the storage device and the volume thereof continue to increase as semiconductor manufacturing technologies develop. The high degree of integration of the storage device makes it possible to reduce costs needed to manufacture the storage device. However, the high degree of integration of the storage device causes a scale-down and a structure change of the storage device, and thus various new issues occur. Since such issues may cause damage to data stored in the storage device, the reliability of the storage device may be reduced. There is a need for a method and a device capable of improving the reliability of the storage device.

SUMMARY

Embodiments of the inventive concept provide a nonvolatile memory device which may provide improved reliability, a storage device including the nonvolatile memory device, and a reading method of the nonvolatile memory device.

One aspect of embodiments of the inventive concept is directed to provide a nonvolatile memory device which includes at least one memory block and a row decoder circuit. The memory block includes at least a first memory block comprising a plurality of cell strings arranged in rows and columns stacked perpendicular to a substrate, wherein the cell strings include: string select transistors (SSTs) connected to string select lines (SSLs), ground select transistors (GSTs) connected to ground select lines (GSLs), a plurality of nonvolatile memory cells connected to word lines, and first and second dummy memory cells connected to first and second dummy word lines. The row decoder circuit is configured to apply voltage waveforms to the SSLs, GSLs, word lines, and first and second dummy word lines during a data read operation, including: applying a string line select voltage to a selected SSL for selected cell strings to turn on the SSTs of the selected cell strings, applying a ground line select voltage to a selected GSL for selected cell strings to turn on the GSTs of the selected cell strings, applying a read pass voltage to unselected word lines of unselected nonvolatile memory cells to turn on the unselected nonvolatile memory cells of the selected cell strings, applying a read select voltage to a selected word line of selected nonvolatile memory cells to read data from the selected nonvolatile memory cells, applying a SSL prepulse to SSLs of unselected cell strings, and then applying an unselected SSL voltage to turn off the SSTs of the unselected cell strings; applying a GSL prepulse to GSLs of unselected cell strings, and then applying an unselected GSL voltage to turn off the GSTs of the unselected cell strings; applying a first dummy word line prepulse to the first dummy word line such that the first dummy memory cells are turned on and then turned off, and subsequently applying a first dummy word line voltage to the first dummy word line to turn on the first dummy cells again; and applying a second dummy word line prepulse to the second dummy word line such that the second dummy memory cells are turned on and then turned off, and subsequently applying a second dummy word line voltage to the second dummy word line to turn on the second dummy cells again.

In an embodiment, the first dummy word line prepulse and second dummy word line prepulse are applied such that the first and second dummy cells are turned off at approximately a same time as each other.

In an embodiment, the first dummy word line prepulse and second dummy word line prepulse are applied prior to an end of the SSL prepulse and an end of the GSL prepulse.

In an embodiment, nonvolatile memory device includes: a voltage generator; a first dummy word line pass transistor connected between the voltage generator and the first dummy word line to apply the first dummy word line prepulse to the first dummy word line in response to a first dummy word line pass transistor control pulse applied to a control terminal of the first dummy word line pass transistor; and a second dummy word line pass transistor connected between the voltage generator and the second dummy word line to apply the second dummy word line prepulse to the second dummy word line in response to a second dummy word line pass transistor control pulse applied to a control terminal of the second dummy word line pass transistor, wherein a duration of the second dummy word line pass transistor control pulse is less than a duration of the first dummy word line pass transistor control pulse.

In an embodiment, the second dummy word line pass transistor control pulse ends prior to a time when the first dummy word line pass transistor control pulse ends, and a recovery time of the second dummy word line prepulse is greater than a recovery time of the first dummy word line prepulse.

Another aspect of embodiments of the inventive concept is directed to provide a nonvolatile memory device which includes at least one memory block and a row decoder circuit. The memory block, includes at least a first memory block comprising a plurality of cell strings arranged in rows and columns stacked perpendicular to a substrate, wherein the cell strings include: SSTs connected to string select lines (SSLs), ground select transistors (GSTs) connected to ground select lines (GSLs), a plurality of nonvolatile memory cells connected to word lines, and first and second dummy memory cells connected to first and second dummy word lines. The row decoder circuit is configured to apply voltage waveforms to the SSLs, GSLs, word lines, and first and second dummy word line during a data read operation, including: applying a string line select voltage to a selected SSL for selected cell strings to turn on the SSTs of the selected cell strings, applying a ground line select voltage to a selected GSL for selected cell strings to turn on the GSTs of the selected cell strings, applying a read pass voltage to unselected word lines of unselected nonvolatile memory cells to turn on the unselected nonvolatile memory cells of the selected cell strings, applying a read select voltage to a selected word line of selected nonvolatile memory cells to read data from the selected nonvolatile memory cells, applying a SSL prepulse to SSLs of unselected cell strings, and then applying an unselected SSL voltage to turn off the SSTs of the unselected cell strings; applying a GSL prepulse to GSLs of unselected cell strings, and then applying an unselected GSL voltage to turn off the GSTs of the unselected cell strings; applying a first dummy word line prepulse to the first dummy word line such that the first dummy memory cells are turned on and then turned off, and subsequently applying a first dummy word line voltage to the first dummy word line to turn on the first dummy cells again; and applying a second dummy word line prepulse to the second dummy word line such that the second dummy memory cells are turned on and then turned off, and subsequently applying a first dummy word line voltage to the first dummy word line to turn on the first dummy cells again, wherein the row decoder circuit is further configured to apply positive recovery voltages to the word lines and first and second dummy word lines at an end of the data read operation.

Still another aspect of embodiments of the inventive concept is directed to provide a method of performing a data operation for a nonvolatile memory device comprising: at least one memory block, the memory block comprising a plurality of cell strings arranged in rows and columns stacked perpendicular to a substrate, wherein the cell strings include: string select transistors (SSTs) connected to string select lines (SSLs), ground select transistors (GSTs) connected to ground select lines (GSLs), a plurality of nonvolatile memory cells connected to word lines, and first and second dummy memory cells connected to first and second dummy word lines. The method includes: applying a string line select voltage to a selected SSL for selected cell strings to turn on the SSTs of the selected cell strings; applying a ground line select voltage to a selected GSL for selected cell strings to turn on the GSTs of the selected cell strings; applying a read pass voltage to unselected word lines of unselected nonvolatile memory cells to turn on the unselected nonvolatile memory cells of the selected cell strings; applying a read select voltage to a selected word line of selected nonvolatile memory cells to read data from the selected nonvolatile memory cells; applying a SSL prepulse to SSLs of unselected cell strings, and then applying an unselected SSL voltage to turn off the SSTs of the unselected cell strings; applying a GSL prepulse to GSLs of unselected cell strings, and then applying an unselected GSL voltage to turn off the GSTs of the unselected cell strings; applying a first dummy word line prepulse to the first dummy word line such that the first dummy memory cells are turned on, then turned off, and subsequently applying a first dummy word line voltage to the first dummy word line to turn on the first dummy cells again; and applying a second dummy word line prepulse to the second dummy word line such that the second dummy memory cells are turned on and then turned off, and subsequently applying a first dummy word line voltage to the first dummy word line to turn on the first dummy cells again.

Yet another aspect of embodiments of the inventive concept is directed to provide a method of performing a data operation for a nonvolatile memory device comprising: at least one memory block, the memory block comprising a plurality of cell strings arranged in rows and columns stacked perpendicular to a substrate, wherein the cell strings include: string select transistors (SSTs) connected to string select lines (SSLs), ground select transistors (GSTs) connected to ground select lines (GSLs), a plurality of nonvolatile memory cells connected to word lines, and first and second dummy memory cells connected to first and second dummy word lines. The method comprises: applying a string line select voltage to a selected SSL for selected cell strings to turn on the SSTs of the selected cell strings, applying a ground line select voltage to a selected GSL for selected cell strings to turn on the GSTs of the selected cell strings; applying a read pass voltage to unselected word lines of unselected nonvolatile memory cells to turn on the unselected nonvolatile memory cells of the selected cell strings; applying a read select voltage to a selected word line of selected nonvolatile memory cells to read data from the selected nonvolatile memory cells; applying a SSL prepulse to SSLs of unselected cell strings, and then applying an unselected SSL voltage to turn off the SSTs of the unselected cell strings; applying a GSL prepulse to GSLs of unselected cell strings, and then applying an unselected GSL voltage to turn off the GSTs of the unselected cell strings; applying a first dummy word line prepulse to the first dummy word line such that the first dummy memory cells are turned on and then turned off, and subsequently applying a first dummy word line voltage to the first dummy word line to turn on the first dummy cells again; applying a second dummy word line prepulse to the second dummy word line such that the second dummy memory cells are turned on and then turned off, and subsequently applying a first dummy word line voltage to the first dummy word line to turn on the first dummy cells again; and applying positive recovery voltages to the word lines and first and second dummy word lines at an end of the data read operation.

BRIEF DESCRIPTION OF THE FIGURES

The above and other objects and features will become apparent from the following description with reference to the following figures, wherein like reference numerals refer to like parts throughout the various figures unless otherwise specified.

FIG. 9 is a graph illustrating examples of dummy word line pass transistor control pulses of a row decoder circuit, and the resulting voltages which are applied to the corresponding dummy memory cells.

DETAILED DESCRIPTION

Below, embodiments of the inventive invention will be described more fully with reference to accompanying drawings such that an ordinary one in the art implements embodiments of the invention.

Figure 1:
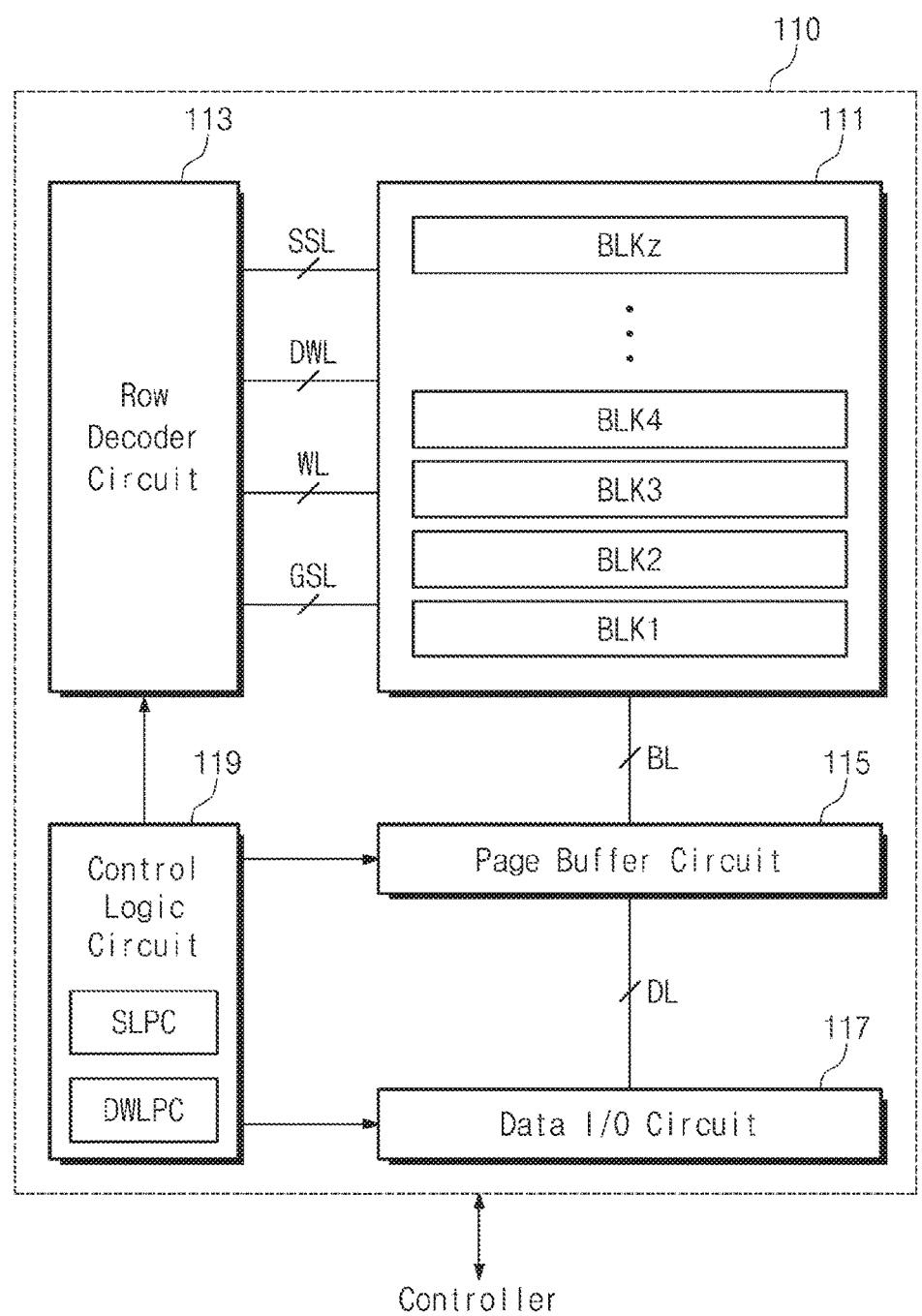
FIG. 1 is a block diagram illustrating a nonvolatile memory device according to an embodiment of the inventive concept.

FIG. 1 is a block diagram illustrating a nonvolatile memory device 110 according to an embodiment of the inventive concept. Referring to FIG. 1, nonvolatile memory device 110 may include a memory cell array 111, a row decoder circuit 113, a page buffer circuit 115, a data input/output circuit 117, and a control logic circuit 119.

Memory cell array 111 includes a plurality of memory blocks BLK1 to BLKz. Each of the memory blocks BLK1 to BLKz includes a plurality of memory cells. Each of the memory blocks BLK1 to BLKz may be connected to the row decoder circuit 113 through at least one ground selection line GSL, a plurality of word lines WL, a plurality of dummy word lines DWL, and at least one string selection line SSL. Each of the memory blocks BLK1 to BLKz may be connected to page buffer circuit 115 through a plurality of bit lines BL. The memory blocks BLK1 to BLKz may be connected in common to the plurality of bit lines BL. The memory cells in the memory blocks BLK1 to BLKz may have the same structures as each other.

In an embodiment, each of the memory blocks BLK1 to BLKz may be a unit of memory cells which all may be erased together in one erase operation. That is, the memory cells in memory cell array 111 may be erased in units of memory blocks. The memory cells belonging to a memory block may be erased at the same time as each other. In another embodiment, each of the memory blocks BLK1 to BLKz may be divided into a plurality of sub-blocks. In that case, each of the sub-blocks may be a unit of memory cells which all may be erased together in one erase operation.

Row decoder circuit 113 is connected to memory cell array 111 through a plurality of ground selection lines GSL, the plurality of word lines WL, the plurality of dummy word lines DWL, and a plurality of string selection lines SSL. Row decoder circuit 113 operates according to control of control logic circuit 119. Row decoder circuit 113 may decode an address received from a controller 120 (refer to FIG. 17) through an input/output channel and may control voltages to be applied during a program, read, or erase operation to the string selection lines SSL, the word lines WL, the dummy word lines DWL, and the ground selection lines GSL based on the decoded address.

Page buffer circuit 115 is connected to memory cell array 111 through the bit lines BL. Page buffer circuit 115 is connected to data input/output circuit 117 through a plurality of data lines DL. Page buffer circuit 115 may operate under control of control logic circuit 119. During the program operation, page buffer circuit 115 may store data to be programmed in memory cells. Page buffer circuit 115 may apply voltages to the bit lines BL based on the stored data. During the read operation or a verification read operation, page buffer circuit 115 may sense voltages on the bit lines BL and may store the sensed results therein.

Data input/output circuit 117 is connected with page buffer circuit 115 through the data lines DL. Data input/output circuit 117 may output data, which is read by page buffer circuit 115, to controller 120 through the input/output channel and may provide data, which is received from controller 120 through the input/output channel, to page buffer circuit 115.

Control logic circuit 119 may receive a command from controller 120 through the input/output channel and may receive a control signal therefrom through a control channel. Control logic circuit 119 may decode the received command and may control nonvolatile memory device 110 based on the decoded command. For example, control logic circuit 119 may control nonvolatile memory device 110 so as to perform the program, read or erase operation.

Control logic circuit 119 includes a selection line prepulse controller SLPC and a dummy word line prepulse controller DWLPC. The selection line prepulse controller SLPC may control row decoder circuit 113 such that a selection line prepulse is applied to selection lines of unselected cell strings in a selected memory block, for example, string selection lines or ground selection lines, during the read operation. The dummy word line prepulse controller DWLPC may control row decoder circuit 113 such that prepulses (or a dummy word line prepulses) are applied to dummy word lines of a selected memory block during the read operation.

In an embodiment, the selected memory block may refer to memory cells that are selected as read targets by an address during the read operation (or program operation). The selected memory block may refer to a memory block that includes selected memory cells. Selected cell strings may refer to cell strings that include memory cells of the selected memory block that are selected as read targets. Selected selection lines may refer to string selection lines or ground selection lines that are connected to selected cell strings of a selected memory block. A selected word line may refer to a word line that is connected to memory cells including selected memory cells in a selected memory block. An unselected word line may refer to a word line that is not connected to selected memory cells in a selected memory block. A prepulse may be a signal that has a waveform which turns off a memory cell, a dummy memory cell, a ground selection transistor, or a string selection transistor, to which the prepulse is applied, after turning on the memory cell, the dummy memory cell, the ground selection transistor, or the string selection transistor.

Figure 2:
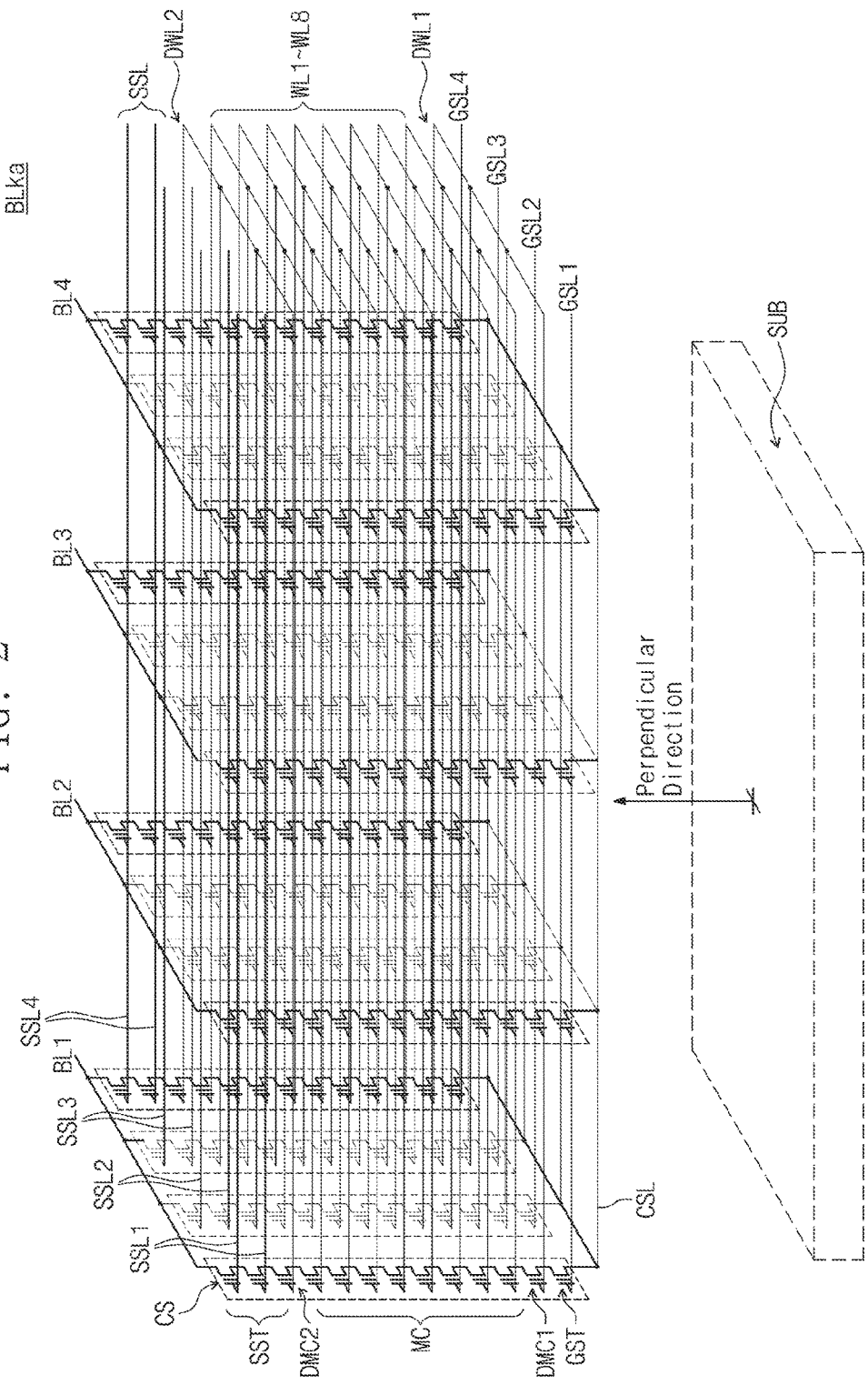
FIG. 2 illustrates an example of a memory block according to an embodiment of the inventive concept.

FIG. 2 illustrates an example of a memory block BLKa according to an embodiment of the inventive concept. Referring to FIGS. 1 and 2, a plurality of cell strings CS may be arranged on a substrate SUB in rows and columns. The cell strings CS may be connected in common to a common source line CSL that is formed on (or in) the substrate SUB. In FIG. 2, a location of the substrate SUB is exemplified to help understand a structure of the memory block BLKa. An embodiment is exemplified in FIG. 2 as the common source line CSL is connected to lower ends of the cell strings CS. In an embodiment, it is sufficient if the common source line CSL is electrically connected to the lower ends of the cell strings CS. However, embodiments are not limited to the case that the common source line CSL is physically located at the lower ends of the cell strings CS. An embodiment is exemplified in FIG. 2 wherein the cell strings CS are arranged in a four-by-four matrix. However, the number of cell strings CS in the memory block BLKa may be greater or less than four.

Cell strings of each row may be connected to a corresponding one of first to fourth ground selection lines GSL1 to GSL4 and a corresponding one of first to fourth string selection lines SSL1 to SSL4. Cell strings of each column may be connected to a corresponding one of first to fourth bit lines BL1 to BL4. For ease of illustration, cell strings that are connected to the second and third ground selection lines GSL2 and GSL3 or the second and third string selection lines SSL2 and SSL3 may be depicted faintly in FIG. 2.

Each cell string CS may include at least one ground selection transistor GST connected to a corresponding ground selection line, a first dummy memory cell DMC1 connected to a first dummy word line DWL1, a plurality of memory cells MC respectively connected to a plurality of word lines WL1 to WL8, a second dummy memory cell DMC2 connected to a second dummy word line DWL2, and string selection transistors SST respectively connected to string selection lines SSL. In each cell string CS, the ground selection transistor GST, the first dummy memory cell DMC1, the memory cells MC, the second dummy memory cell DMC2, and the string selection transistors SST may be serially connected to each other along a direction perpendicular to the substrate SUB and may be sequentially stacked along a direction perpendicular to the substrate SUB.

In an embodiment, as illustrated in FIG. 2, one or more dummy memory cells may be arranged between the ground selection transistor GST and the memory cells MC in each cell string CS. In each cell string CS, one or more dummy memory cells may be arranged between the string selection transistors SST and the memory cells MC. In each cell string CS, one or more dummy memory cells may be arranged between the memory cells MC. The dummy memory cells may have the same structure as the memory cells MC and may not be programmed (e.g., program inhibited) or may be programmed differently from the memory cells MC. For example, when memory cells are programmed to form two or more threshold voltage distributions, the dummy memory cells may be programmed to have one threshold voltage distribution range or to have threshold voltage distributions of which the number is less than that of the memory cells MC.

Memory cells of the cell strings CS that are arranged at the same height (or order) from the substrate SUB or the ground selection transistor GST may be electrically connected to each other. Memory cells of different cell strings CS that are arranged at different heights (or orders) from the substrate SUB or the ground selection transistor GST may be electrically separated from each other. An embodiment is established in FIG. 2 as memory cells of the same height are connected to the same word line. However, the memory cells of the same height may be directly connected to each other in a plane where the memory cells are formed or may be indirectly connected to each other through another layer such as a metal layer.

The memory block BLKa may be provided at a three-dimensional (3D) memory array. The 3D memory array is monolithically formed in one or more physical levels of arrays of memory cells MC having an active area disposed above a silicon substrate, and a circuitry associated with the operation of those memory cells MC. The circuit associated with an operation of memory cells MC may be located above or within such substrate. The term "monolithic" means that layers of each level of the array are directly deposited on the layers of each underlying level of the 3D memory array.

In an embodiment of the inventive concept, the 3D memory array includes vertical NAND strings (or cell strings) that are vertically oriented such that at least one memory cell is located over another memory cell. The at least one memory cell may comprise a charge trap layer. Each vertical NAND string may further include at least one selection transistor placed over the memory cells MC. The at least one selection transistor may have the same structure as the memory cells MC and may be formed uniformly with the memory cells MC.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and U.S. Pat. Pub. No. 2011/0233648.

Figure 3:
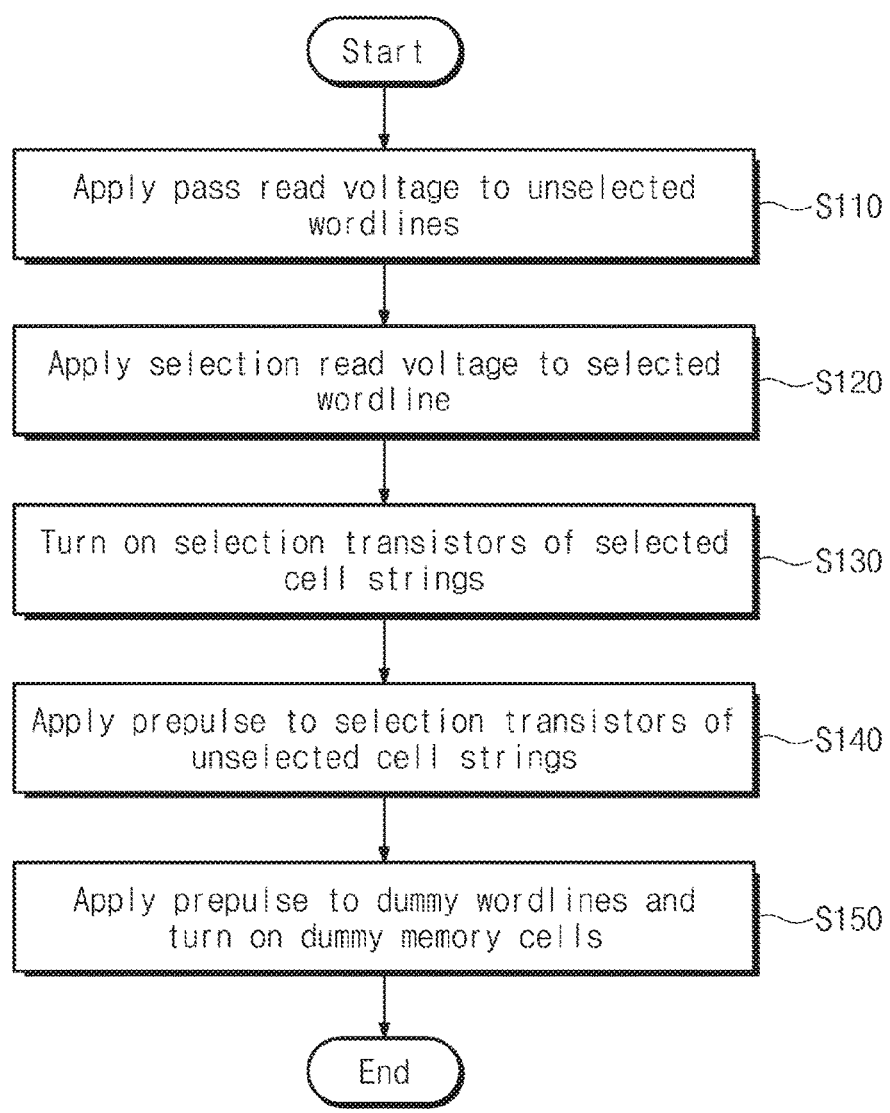
FIG. 3 is a flowchart illustrating a method in which the nonvolatile memory device performs a read operation, according to an embodiment of the inventive concept.

FIG. 3 is a flowchart illustrating a method in which nonvolatile memory device 110 according to an embodiment of the inventive concept performs a read operation. Referring to FIGS. 1 and 3, nonvolatile memory device 110 may perform a read operation in response to a read command and an address that are received from controller 120 (refer to FIG. 17). In an embodiment, it is assumed that memory cells that correspond to the first string selection lines SSL1 and a fourth word line WL4 of the memory block BLKa are selected as read targets.

In operation S110, row decoder circuit 113 applies a pass read voltage to unselected word lines WL1 to WL3 and WL5 to WL8 of the selected memory block BLKa. In operation S120, row decoder circuit 113 applies a selection read voltage to the selected word line WL4. The pass read voltage may be a high voltage enough to turn on memory cells MC regardless of whether any data is stored in the memory cells. The selection read voltage may have a level between threshold voltage distribution ranges that the memory cells MC have on the basis of data written in the memory cells MC.

In operation S130, row decoder circuit 113 may turn on the ground selection transistors GST and the string selection transistors SST of selected cell strings, that is, cell strings connected to the first string selection lines SSL1.

In operation S140, row decoder circuit 113 may apply a ground selection line (GSL) prepulse to each of the ground selection transistors GST, and a string selection line (SSL) prepulse to each of the string selection transistors SST, of unselected strings, that is, the second to fourth string selection lines SSL2 to SSL4 while voltages of unselected word lines increase to target levels thereof.

In operation S150, row decoder circuit 113 may apply a dummy word line prepulse to each of the first and second dummy word lines DWL1 and DWL2 while the voltages of the unselected word lines increases to a target level of the read voltage. Afterwards, row decoder circuit 113 may turn on the first and second dummy memory cells DMC1 and DMC2. For example, the row decoder circuit 113 may apply the pass read voltage to the first and second dummy memory cells DMC1 and DMC2.

Figure 4:
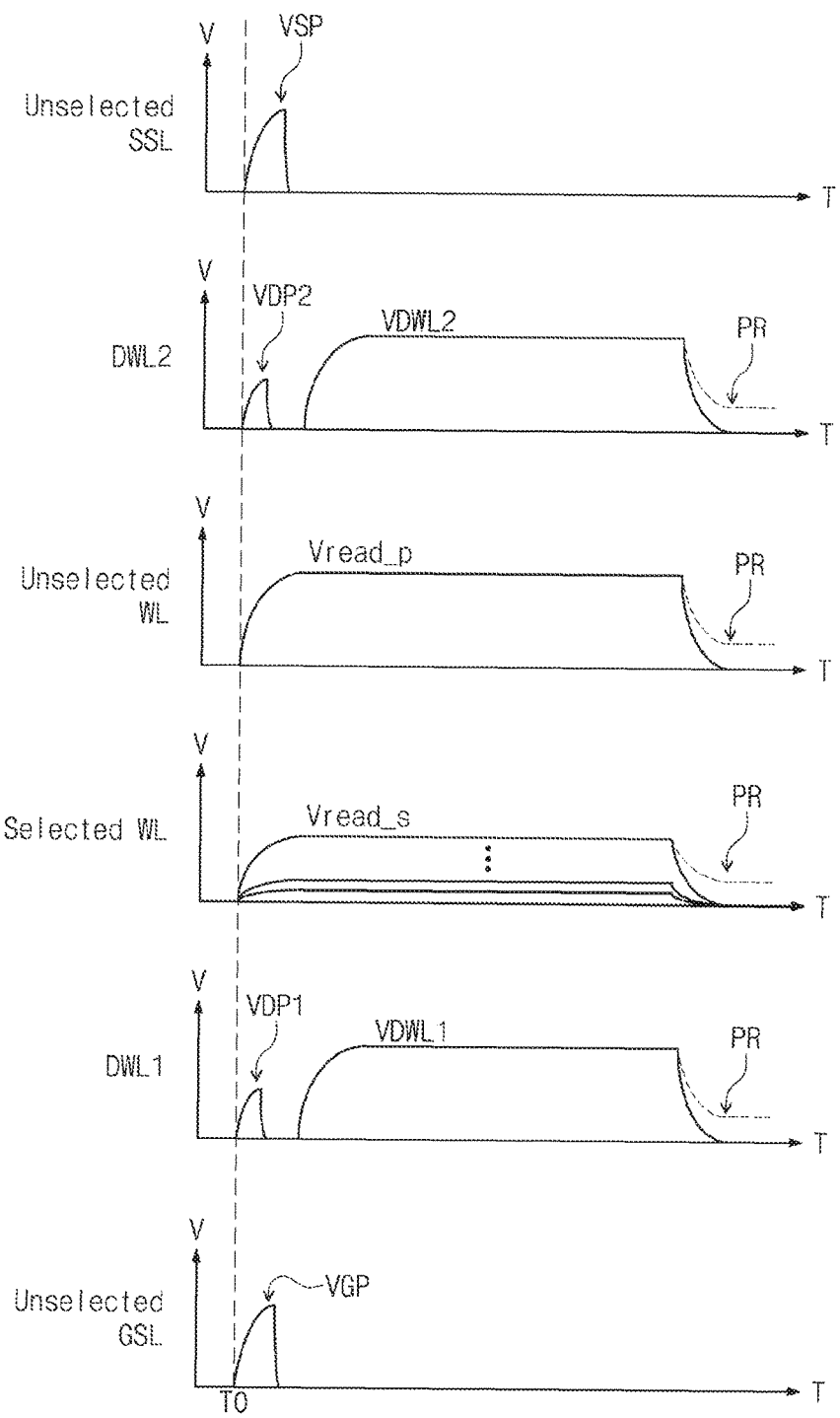
FIG. 4 illustrates an example of waveforms of voltages that are applied to the memory block based on the flowchart of FIG. 3.

FIG. 4 illustrates an example of waveforms of voltages that are applied to the memory block BLKa based on the flowchart of FIG. 3. Waveforms of voltages that are applied to unselected cell strings of the memory block BLKa are exemplified in FIG. 4. In FIG. 4, the abscissa represents time (T), and the ordinate represents voltage (V).

Referring to FIGS. 1 to 4, at T0, voltages may be applied to the memory block BLKa. However, a time point when voltages are applied to the memory block BLKa may not be limited to the same time point. For example, some of the voltages illustrated in FIG. 4 may be applied prior to the remaining voltages.

A pass read voltage Vread_p is applied to unselected word lines WL1 to WL3 and WL5 to WL8 of the memory block BLKa (operation S110). Voltages of the unselected word lines WL1 to WL3 and WL5 to WL8 may gradually increase to a target level of the pass read voltage Vread_P and may reach the target level at T4 (see FIG. 5). In an embodiment, a level of the pass read voltage Vread_p may be variable. For example, the target levels of the pass read voltage Vread_p may decrease as a distance between the substrate SUB and the memory cells MC increases. Also, the target levels of the pass read voltage Vread_p may become higher as memory cells of an unselected word line becomes closer to memory cells of the selected word line WL4.

A selection read voltage Vread_s is applied to the selected word line WL4 of the memory block BLKa (operation S120). The selection read voltage Vread_s may have different levels based on threshold voltage distribution ranges to be distinguished through a read operation. For example, the selection read voltage Vread_s may have one of a plurality of levels as illustrated in FIG. 4.

A string selection line (SSL) prepulse VSP is applied to unselected string selection lines SSL2 to SSL4, and a ground selection line (GSL) prepulse VGP is applied to unselected ground selection lines GSL1 to GSL4 (operation S140). The SSL prepulse VSP and GSL prepulse VGP may turn off the string selection transistors SST and the ground selection transistors GST of unselected cell strings after turning on the string selection transistors SST and the ground selection transistors GST of the unselected cell strings. The string selection transistors SST and the ground selection transistors GST of unselected cell strings may remain at a turn-off state after the SSL prepulse VSP or GSL prepulse VGP is applied thereto.

A first dummy word line voltage VDWL1 may be applied to the first dummy word line DWL1 after a first dummy word line prepulse VDP1 is applied thereto, and a second dummy word line voltage VDWL2 may be applied to the second dummy word line DWL2 after a second dummy word line prepulse VDP2 is applied thereto (operation S150). The first and second dummy word line prepulses VDP1 and VDP2 may turn on the dummy memory cells DMC1 and DMC2, respectively, and then turn off the dummy memory cells DMC1 and DMC2. The first and second dummy word line voltages VDWL1 and VDWL2 may turn on the dummy memory cells DMC1 and DMC2 again after the first and second dummy word line prepulses VDP1 and VDP2, respectively.

In an embodiment, the selection transistors SST and GST and the dummy memory cells DMC1 and DMC2 are turned on by the corresponding prepulse VSP, VGP, VDP1, or VDP2 while the pass read voltages Vread_p of the unselected word lines WL1 to WL3 and WL5 to WL8 increase to a target level thereof.

In an embodiment, selected memory cells, to which the selection read voltage Vread_s is applied, may be turned on or off according to threshold voltages thereof. Accordingly, a voltage change will be described under the condition that memory cells are classified into memory cells that correspond to the word lines WL1 to WL3 closer to the common source line CSL than the selected word line WL4, and memory cells that correspond to the word lines WL5 to WL8 closer to the bit lines BL1 to BL4 than the selected word line WL4.

Channel voltages of memory cells corresponding to the word lines WL1 to WL3 may increase, for example may be boosted, by the coupling while voltages of the word lines WL1 to WL3 increase to a target level of the pass read voltage Vread_p. Memory cells are connected to the common source line CSL through the first dummy memory cell DMC1 and the ground selection transistors GST, and a voltage of the common source line CSL may be maintained with a ground voltage or a low voltage having a level similar to that of the ground voltage. Accordingly, the boosted voltage is discharged through the common source line CSL, and the boosting of channel voltages of the memory cells is suppressed.

Likewise, channel voltages of memory cells corresponding to the word lines WL5 to WL8 may be boosted while voltages of the word lines WL5 to WL8 increase to the target level of the pass read voltage Vread_p. Memory cells are connected to the bit lines BL1 to BL4 through the second dummy memory cell DMC2 and the string selection transistors SST, and voltages of the bit lines BL1 to BL4 may be maintained with a ground voltage or a low voltage having a level similar to that of the ground voltage. Accordingly, the boosted voltage is discharged through the bit lines BL1 to BL4, and the boosting of channel voltages of the memory cells is suppressed.

If the boosting of unselected cell strings is suppressed, it is possible to prevent hot electron injection or Fowler-Nordheim (F-N) tunneling from occurring due to a difference between boosting voltages at channels of memory cells in the unselected cell strings. Accordingly, the stress applied to the memory cells of the unselected cell strings may be reduced. This may mean that the integrity of data written in the memory cells is improved.

The prepulses VGP, VSP, VDP1, and VDP2 may turn off the selection transistors GST and SST and the dummy memory cells DMC1 and DMC2 before voltages of the unselected word lines WL1 to WL3 and WL5 to WL8 reach a target level of the pass read voltage Vread_p. That is, memory cells of unselected cell strings may be electrically separated from the common source line CSL and the bit lines BL1 to BL4. After memory cells are electrically separated from the common source line CSL and the bit lines BL1 to BL4, channel voltages of the memory cells may increase as voltages of the unselected word lines WL1 to WL3 and WL5 to WL8 increase. That is, since the unselected cell strings are boosted, it is possible to prevent threshold voltages of memory cells from being disturbed due to a voltage difference between channels of the memory cells and the unselected word lines WL1 to WL3 and WL5 to WL8, or to reduce the disturbance of the threshold voltages of the memory cells.

After the supplying of the first and second dummy word line prepulses VDP1 and VDP2 to the dummy word lines DWL1 and DWL2 are completed, the first and second dummy word line voltages VDWL1 and VDWL2 are respectively applied to the dummy word lines DWL1 and DWL2. The first and second dummy word line voltages VDWL1 and VDWL2 may turn on the dummy memory cells DMC1 and DMC2. In an embodiment, each of the first and second dummy word line voltages VDWL1 and VDWL2 may be the pass read voltage Vread_p.

If the read operation is completed, voltages applied to the memory block BLKa are recovered. For example, the dummy word line DWL1 or DWL2 or the unselected word lines WL1 to WL3 and WL5 to WL8 may be recovered to a ground voltage or a positive voltage. The recovery of the dummy word line DWL1 or DWL2, the selected word line WL4, or the unselected word lines WL1 to WL3 and WL5 to WL8 may be positive recovery (PR). The positive recovery PR of the selected word line WL4 may recover a voltage of the selected word line WL4 to a level which is lower than those of the selection read voltages Vread_s, or a level between the highest and lowest voltages of the selection read voltages Vread_s.

In an embodiment, the prepulse VGP, VSP, VDP1, or VDP2 may have a target level and may be controlled such that the prepulse VGP, VSP, VDP1, or VDP2 is recovered after reaching the target level. As another example, the prepulse VGP, VSP, VDP1, or VDP2 may have a target level and may be controlled such that the prepulse VGP, VSP, VDP1, or VDP2 is recovered when reaching an intermediate level lower than the target level. For example, the target level may be a final level (or a stable-state level) of a voltage supplied from a voltage generator.

In an embodiment, the prepulse may be applied to the selected word line WL4. In this case, a waveform of a voltage of the selected word line WL4 may be transformed to a form in which the selection read voltage Vread_s is applied after the prepulse is applied, like waveforms of voltages of the unselected word lines WL1 to WL3 and WL5 to WL8 and the dummy word lines DWL1 and DWL2.

As described above, the nonvolatile memory device 110 according to an embodiment of the inventive concept may suppress boosting of memory cells of unselected cell strings in a selected memory block during the read operation. Boosted voltages of memory cells closer to the common source line CSL than the selected word line WL4 may be discharged by temporarily turning on the first dummy memory cells DMC1 and the ground selection transistors GST. That is, the boosting may be suppressed. Boosted voltages of memory cells closer to the bit lines BL1 to BL4 than to the selected word line WL4 may be discharged by temporarily turning on the second dummy memory cells DMC2 and the string selection transistors SST. That is, the boosting may be suppressed.

However, a final boosting voltage of channels (hereinafter referred to as "first channels") of memory cells close to the common source line CSL and a final boosting voltage of channels (hereinafter referred to as "second channels") of memory cells close to the bit lines BL1 to BL4 may be different from each other based on a time period needed to discharge voltages of the first channels and a time period needed to discharge voltages of the second channels. If the final boosting voltage of the first channels and the final boosting voltage of the second channels are different from each other, the hot electron injection or F-N tunneling may occur due to a voltage difference between the first channels and the second channels, thereby causing a decrease in the integrity of data stored in the memory cells.

The string selection transistors SST and the ground selection transistors GST are arranged at opposite ends of the cell strings CS. Due to a characteristic of a program method of the nonvolatile memory device 110, it is very difficult to program the string and ground selection transistors SST and GST such that threshold voltages thereof are distributed within a narrow distribution range. That is, threshold voltages of the string and ground selection transistors SST and GST are distributed across a wide distribution range. This means that even though the same prepulse waveform is applied to the string and ground selection transistors SST and GST, time points when the string or ground selection transistors SST or GST are turned on or off are distributed within a wide time range. If turn-on or turn-off time points are dispersed, time periods when voltages of the first channels and the second channels are discharged are dispersed, and thus the final boosting voltages of the first channels and the second channels may be different from each other. That is, the integrity of the data of memory cells in unselected cell strings may be compromised. Also, the string selection transistors SST and the ground selection transistors GST are connected to different string selection lines or different ground selection lines for respective rows such that they are controlled independently of each other. In contrast, memory cells connected to rows of the same height may be connected in common so as to be controlled the same as each other. That is, since a connection structure of the string selection transistors SST and the ground selection transistors GST is different from a connection structure of the memory cells MC, boosting voltages of cell strings in different rows may be different from each other.

To solve the above-described issue, nonvolatile memory device 110 according to an embodiment of the inventive concept may adjust discharge time periods of unselected cell strings by using the dummy memory cells DMC1 and DMC2 instead of the selection transistors SST and GST. Since the dummy memory cells DMC1 and DMC2 are able to be programmed in the same method as the memory cells MC, the dummy memory cells DMC1 and DMC2 have a threshold voltage distribution narrower than the string selection transistors SST and the ground selection transistors GST. Also, the dummy memory cells DMC1 and DMC2 have the same connection structure as the memory cells MC. Accordingly, discharge time periods of unselected cell strings may be adjusted more finely by using the dummy memory cells DMC1 and DMC2.

In an embodiment, as illustrated in FIG. 4, the positive recovery PR may be performed on the unselected word lines WL1 to WL3 and WL5 to WL8 or the dummy word lines DWL1 and DWL2. If the positive recovery PR is performed, a decrement of voltages of the unselected word lines WL1 to WL3 and WL5 to WL8 or the dummy word lines DWL1 and DWL2 may be reduced. That is, since the influence of the negative coupling is reduced during a recovery operation, the decrement of voltages of the first and second channels of unselected cell strings may be reduced. For this reason, even though the boosting voltage of the first and second channels are adjusted (or restricted) to a low voltage, it is possible to prevent channel voltages of the unselected cell strings from being lowered to a negative voltage during the recovery operation. That is, in the case where the positive recovery PR is performed, it may be possible to more easily adjust voltages of the first and second channels by using the prepulse.

Figure 5:
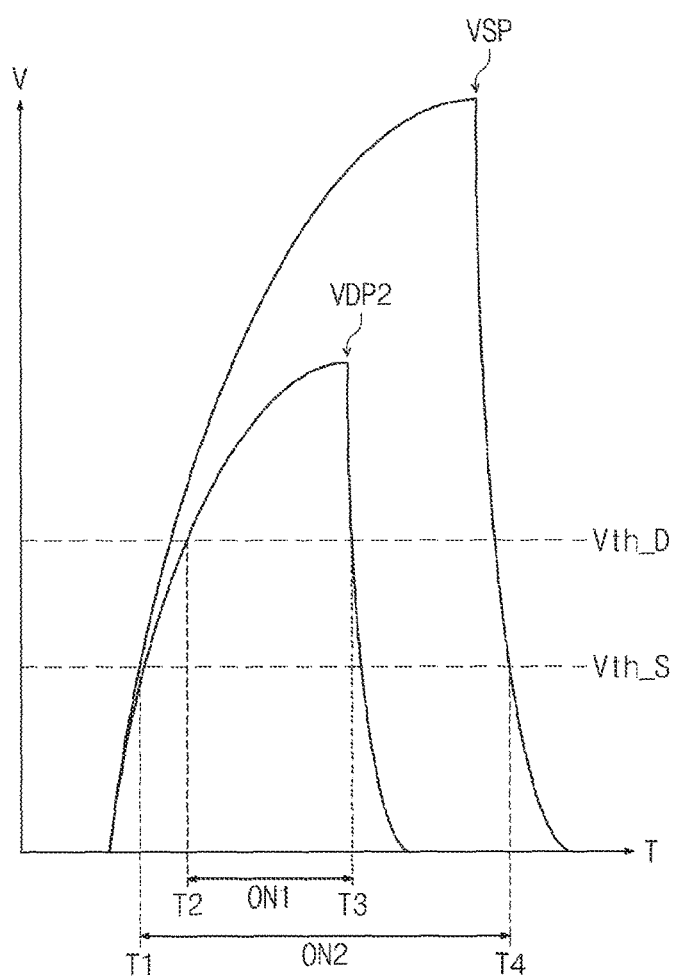
FIG. 5 illustrates a prepulse applied to a string selection transistors and the prepulse applied to a second dummy memory cells in more detail.

FIG. 5 illustrates in more detail examples of the SSL prepulse VSP applied to the string selection transistors SST and the second dummy word line prepulse VDP2 applied to the second dummy memory cells MC2. Voltages applied to one string selection transistor SST and one second dummy memory cell DMC2 are exemplified in FIG. 5. In FIG. 5, the abscissa represents time T, and the ordinate represents voltage V.

At T1, a voltage of the SSL prepulse VSP may increase to reach a threshold voltage Vth_S of the string selection transistor SST. That is, the string selection transistor SST may be turned on at T1.

At T2, a voltage of the second dummy word line prepulse VDP2 may increase to reach a threshold voltage Vth_D of the second dummy memory cell DMC2. That is, the second dummy memory cell DMC2 may be turned on at T2.

At T3, a voltage of the second dummy word line prepulse VDP2 may decrease to reach the threshold voltage Vth_D of the second dummy memory cell DMC2. That is, the second dummy memory cell DMC2 may be turned off at T3.

At T4, a voltage of the SSL prepulse VSP may decrease to reach the threshold voltage Vth_S of the string selection transistor SST. That is, the string selection transistor SST may be turned off at T4.

A time period when the second dummy memory cell DMC2 is turned on may be a first time period ON1, and a time period when the string selection transistor SST is turned on may be a second time period ON2.

As illustrated in FIG. 5, to adjust a discharge time period of unselected cell strings by using the dummy memory cells DMC1 or DMC2, the prepulse VGP, VSP, VDP1, or VDP2 may be controlled such that the second time period ON2 when the selection transistors GST or SST are turned on includes the first time period ON1 when the dummy memory cells DMC1 or DMC2 are turned on. The prepulses VGP, VSP, VDP1, and VDP2 may be controlled such that the selection transistors GST and SST are turned on before the dummy memory cells DMC1 and DMC2 are tuned on and the selection transistors GST or SST are turned off after the dummy memory cells DMC1 and DMC2 are turned off.

If the second time period ON2 includes the first time period ON1, a discharge time period when memory cells are connected to the bit lines BL1 to BL4 and the common source line CSL may be determined by the turn-on and turn-off of the dummy memory cells DMC1 and DMC2.

Figure 6:
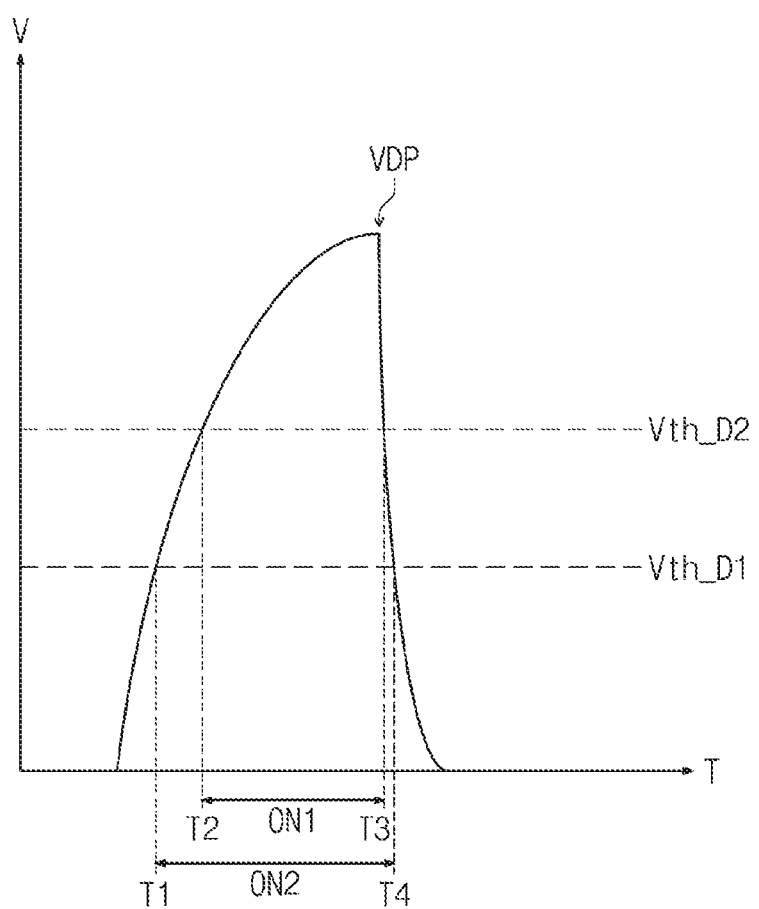
FIG. 6 illustrates an example of the prepulse applied to dummy memory cells.

FIG. 6 illustrates an example of the dummy word line prepulse VDP applied to the dummy memory cells DMC1 and DMC2. In particular, FIG. 6 illustrates an example in which a dummy word line prepulse VDP having the same timing and waveform is applied to the dummy memory cells DMC1 and DMC2, but the dummy memory cells DMC1 and DMC2 have different threshold voltages than each other. In FIG. 6, the abscissa represents time T, and the ordinate represents voltage V.

At T1, a voltage of the dummy word line prepulse VDP may increase to reach a threshold voltage Vth_D1 of the first dummy memory cell DMC1. Accordingly, the first dummy memory cell DMC1 may be turned on at T1.

At T2, a voltage of the dummy word line prepulse VDP may increase to reach a threshold voltage Vth_D2 of the second dummy memory cell DMC2. Accordingly, the second dummy memory cell DMC2 may be turned on at T2.

At T3, a voltage of the dummy word line prepulse VDP may decrease to reach the threshold voltage Vth_D2 of the second dummy memory cell DMC2. Accordingly, the second dummy memory cell DMC2 may be turned off at T3.

At T4, a voltage of the dummy word line prepulse VDP may decrease to reach a threshold voltage Vth_D1 of the first dummy memory cell DMC1. Accordingly, the first dummy memory cell DMC1 may be turned off at T4.

A time period when the first dummy memory cell DMC1 is turned on is a second time period ON2. A time period when the second dummy memory cell DMC2 is turned on is a first time period ON1. If the first time period ON1 and the second time period ON2 are different from each other, in unselected cell strings, a time period when channel voltages are discharged to the bit lines BL1 to BL4 may be different from a time period when channel voltages are discharged to the common source line CSL. For this reason, the boosting voltages of the first channels and the second channels may be different from each other.

As illustrated in FIG. 6, in the case where threshold voltages of the first and second dummy memory cells DMC1 and DMC2 are different from each other, even though the same dummy word line prepulse VDP is applied to the first and second dummy memory cells DMC1 and DMC2, the first time period ON1 and the second time period ON2 may be different from each other, and accordingly the boosting voltages of the first channels and the second channels may be different from each other. For example, in the memory block BLKa illustrated in FIG. 2, the size of memory cells may become larger as a distance from the substrate SUB increases. As such, the size of the second dummy memory cell DMC2 may be larger than the size of the first dummy memory cell DMC1, thereby making threshold voltages of the first and second dummy memory cells DMC1 and DMC2 different from each other.

To compensate for a threshold voltage difference between the first and second dummy memory cells DMC1 and DMC2, nonvolatile memory device 110 according to an embodiment of the inventive concept may differently control the first and second dummy word line prepulses VDP1 and VDP2 to be applied to the first and second dummy memory cells DMC1 and DMC2.

Figure 7:
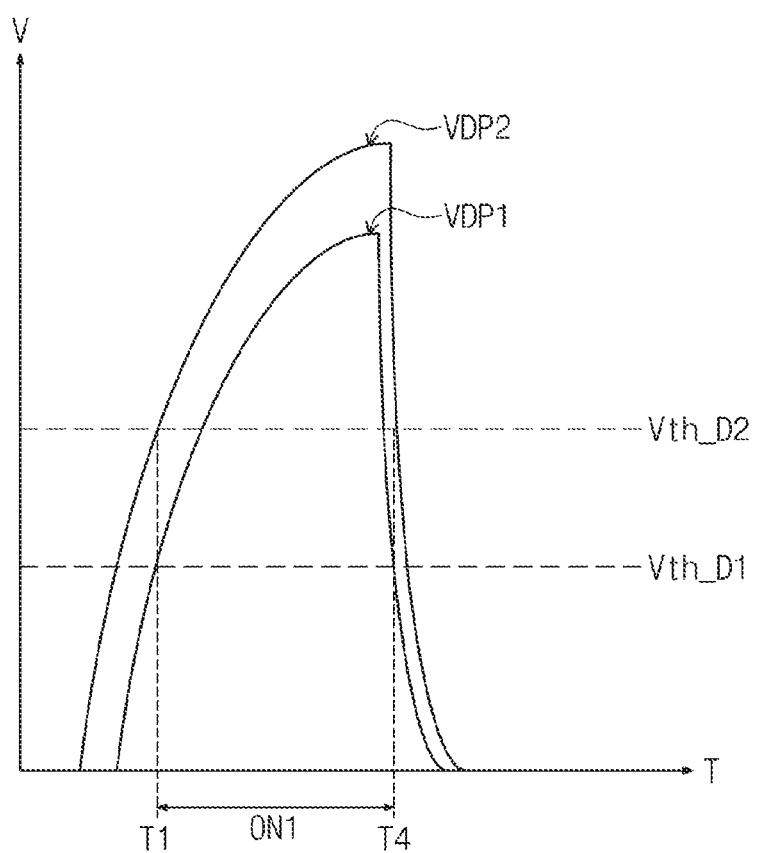
FIG. 7 illustrates an example in which different prepulses are respectively applied to the dummy memory cells.

FIG. 7 illustrates an example in which different first and second dummy word line prepulses VDP1 and VDP2 are respectively applied to the first and second dummy memory cells DMC1 and DMC2. In FIG. 7, the abscissa represents time T, and the ordinate represents voltage V.

Compared to FIG. 6, FIG. 7 illustrates that different first and second dummy word line prepulses VDP1 and VDP2 are respectively applied to the first and second dummy memory cells DMC1 and DMC2. The first dummy word line prepulse VDP1 may be applied to the first dummy memory cell DMC1 at the same timing as described with reference to FIG. 6.

The second dummy word line prepulse VDP2 may be applied to the second dummy memory cell DMC2 before the first dummy word line prepulse VDP1 is applied to the first dummy memory cell DMC1 and may be recovered later than the first dummy word line prepulse VDP1. For example, a level of the second dummy word line prepulse VDP2 and a time point when the second dummy word line prepulse VDP2 starts to be applied to the second dummy memory cell DMC2 may be adjusted such that the second dummy memory cell DMC2 is turned on at T1 when the first dummy memory cell DMC1 is turned on by the first dummy word line prepulse VDP1. Also, a level of the second dummy word line prepulse VDP2 and a time point (hereinafter referred to as "application time period") when the second dummy word line prepulse VDP2 starts to be applied to the second dummy memory cell DMC2 may be adjusted such that the second dummy memory cell DMC2 is turned on at T4 when the first dummy memory cell DMC1 is turned on by the first dummy word line prepulse VDP1.

If the level and application time period of the second dummy word line prepulse VDP2 are adjusted, the dummy memory cells DMC1 and DMC2 may be turned on at the same time. Accordingly, as time periods when unselected cell strings are connected to the bit lines BL1 to BL4 and the common source line CSL are adjusted the same, the first and second channels may be finally boosted to the same level. This may mean that the integrity of data programmed in memory cells is improved.

In an embodiment, when a read operation is performed on nonvolatile memory device 110 by a reference frequency, or when a read error occurs during a read operation, nonvolatile memory device 110 may detect threshold voltages of the dummy memory cells DMC1 and DMC2 and may adjust a level of the first dummy word line prepulse VDP1 or second dummy word line prepulse VDP2 based on the detected threshold voltages. The reference frequency may be a given value, a periodically varying value, or a randomly selected value.

An embodiment is exemplified in FIG. 7 as when threshold voltages of the dummy memory cells DMC1 and DMC2 are different from each other, the levels and application time periods of the first and second dummy word line prepulses VDP1 and VDP2 are adjusted such that the dummy memory cells DMC1 and DMC2 are substantially simultaneously turned on and turned off. However, even though threshold voltages of the dummy memory cells DMC1 and DMC2 are the same as each other, the levels and application time periods of the first and second dummy word line prepulses VDP1 and VDP2 may be adjustable. For example, the dummy memory cells DMC1 and DMC2 may have a cylindrical structure, and the size of the second dummy memory cell DMC2 may be larger than that of the first dummy memory cell DMC1. When threshold voltages of the dummy memory cells DMC1 and DMC2 are the same as each other and when the same voltage higher than the threshold voltages is applied to control gates of the dummy memory cells DMC1 and DMC2, an electric field formed at the first dummy memory cell DMC1 of a relatively small cylinder structure may be stronger than an electric field formed at the second dummy memory cell DMC2 of a relatively large cylinder structure. That is, even though the threshold voltages of the dummy memory cells DMC1 and DMC2 are the same as each other and the same voltage is applied to the dummy memory cells DMC1 and DMC2, the first dummy memory cell DMC1 may be turned on before the second dummy memory cell DMC2 is turned on. A level and an application time period of the second dummy word line prepulse VDP2 applied to the second dummy memory cell DMC2 may be greater than a level and an application time period of the first dummy word line prepulse VDP1 applied to the first dummy memory cell DMC1, such that the dummy memory cells DMC1 and DMC2 are simultaneously turned on or off.

For example, in some embodiments row decoder circuit 113 may include one or more voltage generators and a plurality of pass transistors (e.g., field effect transistors (FETs)) each connected between a voltage generator and a corresponding word line WL or dummy word line DWL and by means of which voltages from the voltage generator may be supplied to the word lines WL and dummy word lines DWL of memory cell array 111. In that case, row decoder circuit 113 may apply a control pulse to a control terminal of a pass transistor which is connected to a dummy word line DWL in order to cause the pass transistor to apply a dummy word line prepulse to the dummy word line DWL. Accordingly, by varying the timing of the control pulses which it applies to the pass transistors, row decoder circuit 113 may adjust the application time period of the second dummy word line prepulse VDP2 applied to the second dummy memory cell DMC2 to be different than the application time period of the first dummy word line prepulse VDP1 applied to the first dummy memory cell DMC1. Furthermore, by varying the voltages of voltage generators connected to the pass transistors, row decoder circuit 113 may adjust the level of the second dummy word line prepulse VDP2 applied to the second dummy memory cell DMC2 to be different than the level of the first dummy word line prepulse VDP1 applied to the first dummy memory cell DMC1.

Figure 8:
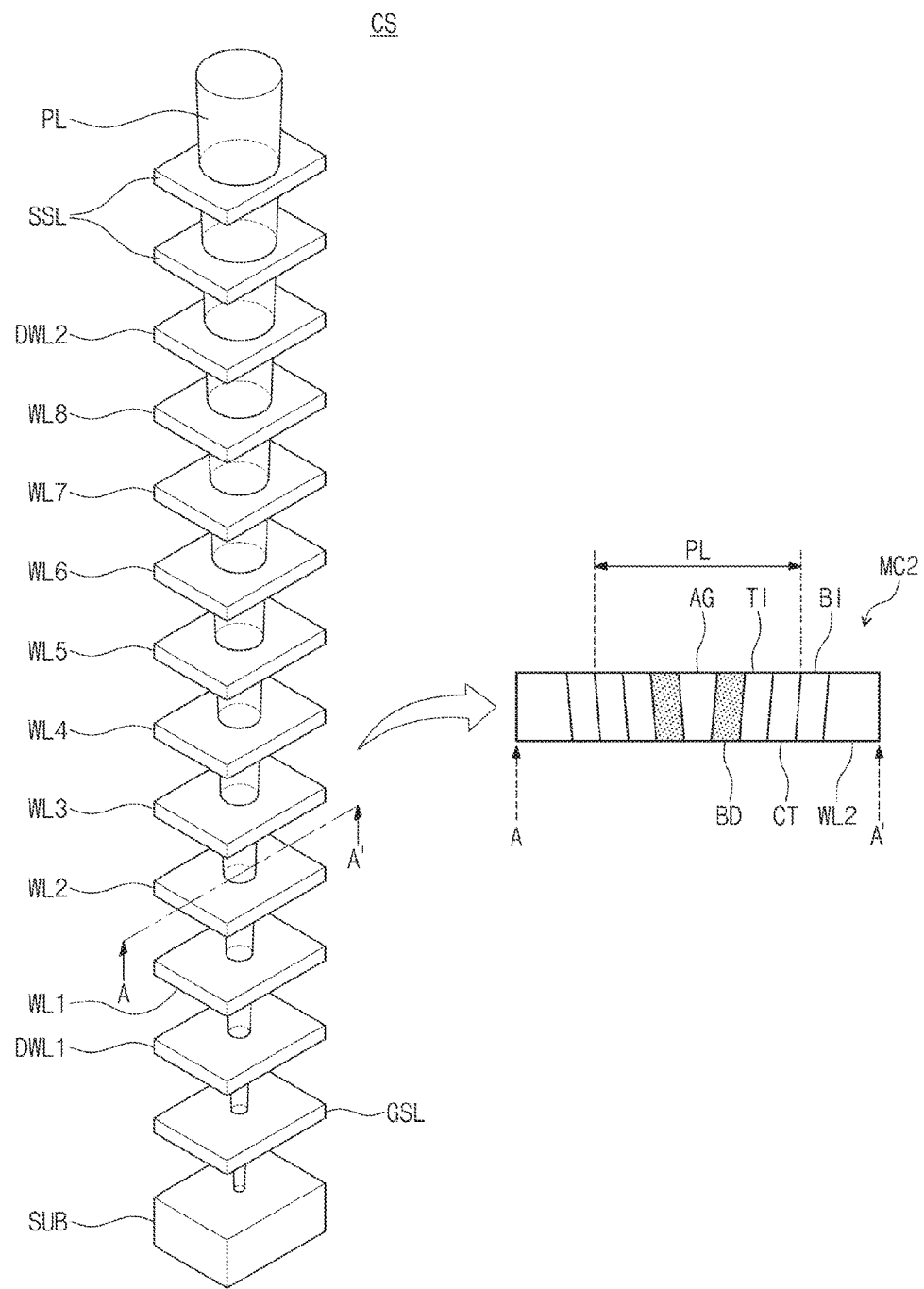
FIG. 8 illustrates an example of a structure of a cell string of the memory block of FIG. 2.

FIG. 8 illustrates an example of a structure of a cell string CS of the memory block BLKa of FIG. 2. Referring to FIGS. 2 and 8, a pillar that extends in a direction perpendicular to the substrate SUB to make contact with the substrate SUB may be provided on the substrate SUB. The ground selection line GSL, the first dummy word line DWL1, the word lines WL1 to WL8, the second dummy word line DWL2, and the string selection lines SSL illustrated in FIG. 8 may be respectively formed of conductive materials parallel with the substrate SUB, for example, metallic materials. The pillar PL may make contact with the substrate SUB through the conductive materials that form the ground selection line GSL, the first dummy word line DWL1, the word lines WL1 to WL8, the second dummy word line DWL2, and the string selection lines SSL.

In FIG. 8, a view taken along a line A-A' is also illustrated. In an embodiment, a sectional view of a second memory cell MC2 corresponding to a second word line WL2 is illustrated in FIG. 8. The pillar PL may include a cylindrical body BD. An air gap AG may be defined in the interior of the body BD. The body BD may include P-type silicon and may be an area where a channel is formed. The pillar PL may further include a cylindrical tunnel insulating layer TI surrounding the body BD and a cylindrical charge trap layer CT surrounding the tunnel insulating layer TI. A block insulating layer BI may be formed between the second word line WL2 and the pillar PL. The body BD, the tunnel insulating layer TI, the charge trap layer CT, the blocking insulating layer BI, and the second word line WL2 may constitute a charge trap type transistor that is formed in a direction perpendicular to the substrate SUB or an upper surface of the substrate SUB. The string selection transistor SST, the ground selection transistor GST, the dummy memory cells, and other memory cells may have the same structure as the second memory cell MC2.

In the process of manufacturing the cell string CS, a width of the pillar PL or a sectional area parallel with an upper surface of the substrate SUB may become smaller as a distance from the substrate SUB decreases. Accordingly, a load of the first dummy memory cell DMC1 (e.g., parasitic resistance of a gate of the first dummy memory cell DMC1 or capacitance between the first dummy word line DWL1 and the body BD) may be smaller than a load of the second dummy memory cell DMC2 (e.g., parasitic resistance of a gate of the second dummy memory cell DMC2 or capacitance between the second dummy word line DWL2 and the body BD). In this case, even though threshold voltages of the first and second dummy memory cells DMC1 and DMC2 are the same each other, timing when the first and second dummy memory cells DMC1 and DMC2 are turned on or off may become different due to a load difference.

FIG. 9 is a graph illustrating examples of dummy word line pass transistor control pulses DWL1_CP and DWL2_CP of a row decoder circuit, and the resulting voltages which are applied to the dummy memory cells DMC1 and DMC2. In FIG. 9, the abscissas represent time, and each ordinate axis represents a voltage of one of the first and second dummy word lines DWL1 and DWL2 or the dummy memory cells DMC1 and DMC2.

Referring to FIGS. 2, 8, and 9, threshold voltages Vth_1 and Vth_2 of the first and second dummy memory cells DMC1 and DMC2 may be the same each other. When the same voltage, for example, the first and second dummy word line prepulses VDP1 and VDP2 having the same target level and the same time durations, are applied to the first and second dummy word lines DWL1 and DWL2, a voltage of a gate of the first dummy memory cell DMC1 having a smaller load, that is, a voltage of the first dummy word line DWL1 may increase faster than a voltage of a gate of the second dummy memory cell DMC2 having a larger load, that is, a voltage of the second dummy word line DWL2. Accordingly, the first dummy memory cell DMC1 may be turned on first, and the second dummy memory cell DMC2 may be turned on later, after the first dummy memory cell DMC1 is turned on. Likewise, when first and second dummy word line prepulses are simultaneously recovered, a voltage of the first dummy word line DWL1 may decrease faster than a voltage of the second dummy word line DWL2. Accordingly, the first dummy memory cell DMC1 may be turned off before the second dummy memory cell DMC2 is turned off, which is undesirable as explained above.

That is, even though the threshold voltages of the first and second dummy memory cells DMC1 and DMC2 are the same each other, loads of the first and second dummy memory cells DMC1 and DMC2 may vary according to locations or sizes thereof, and thus off time points of the first and second dummy memory cells DMC1 and DMC2 may be different than each other.

Accordingly, as illustrated in FIG. 9, in some embodiments the row decoder circuit (e.g., row decoder circuit 113 of FIG. 1) may apply different dummy word line prepulse voltages to the first and second dummy memory cells DMC1 and DMC2. Toward this end, row decoder circuit 113 may apply different control pulses to the control terminals of the pass transistors which are connected to a dummy word lines DWL1 and DWL2 in order to cause the pass transistors to apply different dummy word line prepulses to the dummy word lines DWL1 and DWL2.

FIG. 9 shows a first dummy word line pass transistor control pulse DWL1_CP applied to a control terminal of a first dummy word line pass transistor, and a second dummy word line pass transistor control pulse DWL2_CP applied to a control terminal of a second dummy word line pass transistor, wherein a duration of the second dummy word line pass transistor control pulse is less than a duration of the first dummy word line pass transistor control pulse. In particular, the first dummy word line pass transistor control pulse DWL1_CP and the second dummy word line pass transistor control pulse DWL2_CP both begin at a time t1. The first dummy word line pass transistor control pulse DWL1_CP ends at a time t3, while the second dummy word line pass transistor control pulse DWL3_CP ends at a later time t2.

FIG. 9 also shows that the rise and fall times of the first dummy word line prepulse VDP1 are shorter than the rise and fall times of the second dummy word line prepulse VDP2 are different than each other, due to the load of the first dummy memory cell DMC1 being smaller than the load of the second dummy memory cell DMC2, as explained above with respect to FIG. 8. By properly selecting the times t2 and t3 when the first and second dummy word line pass transistor control pulses DWL1_CP and DWL2_CP end, both the first dummy memory cell DMC1 and the second dummy memory cell DMC2 may turn off at the same time as each other, t4, after the first and second first dummy word line prepulses VDP1 and VDP2. Accordingly, problems described above, which may occur when the first and second dummy memory cells DMC1 and DMC2 turn off at different time than each other, may be prevented.

Figure 10:
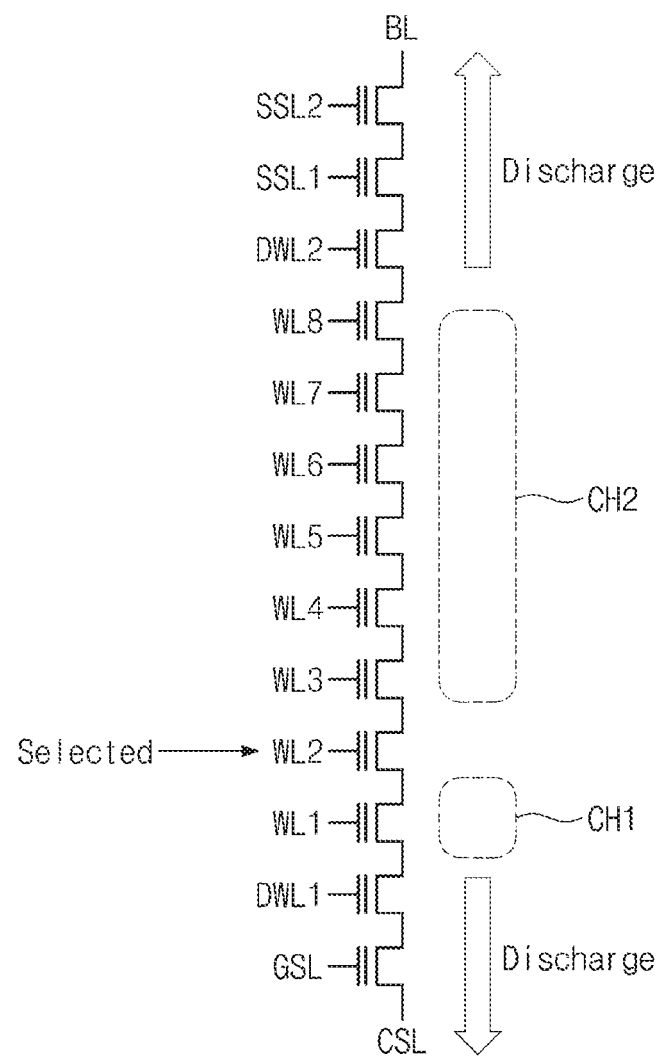
FIG. 10 illustrates an example of an unselected cell string when a second word line close to a common source line is selected.

FIG. 10 illustrates an example of an unselected cell string when a second word line WL2 close to the common source line CSL is selected. Referring to FIG. 10, a first channel CH1 close to the common source line CSL may correspond to one memory cell, and a second channel CH2 close to a bit line BL may correspond to six memory cells. That is, the amount of charge to be discharged from the second channel CH2 may be larger than the amount of charge to be discharged from the first channel CH1. As illustrated in FIG. 10, in the case where the amount of charge of the first channel CH1 is different from that of the second channel CH2, discharge time periods of the first and second channels CH1 and CH2 may change. For example, if an application time period of the second dummy word line prepulse VDP2 applied to the second dummy word line DWL2 is set to be greater than that an application time period of the first dummy word line prepulse VDP1 applied to the first dummy word line DWL1, the amount of charge discharged from the second channel CH2 may be larger than the amount of charge discharged from the first channel CH1. Accordingly, the final boosting voltages of the first and second channels CH1 and CH2 may be equalized. Likewise, when a word line close to the bit line BL is selected, the application time period of the first dummy word line prepulse VDP1 may be set to be longer than the application time period of the second dummy word line prepulse VDP2.

Figure 11:
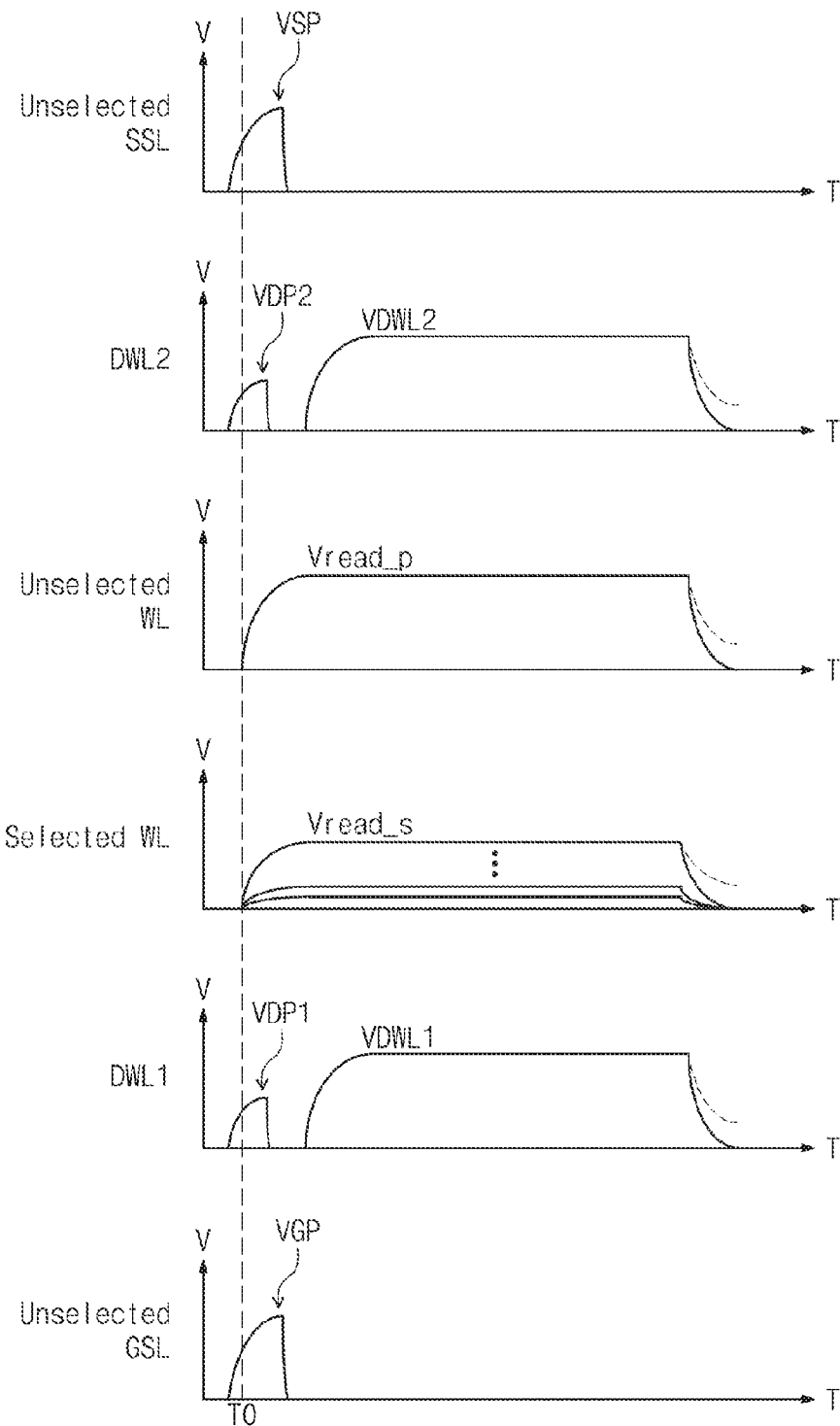
FIG. 11 illustrates an example in which some of voltages of FIG. 4 are applied to the memory block prior to the remaining voltages.

FIG. 11 illustrates an example in which some of voltages of FIG. 4 are applied to the memory block BLKa prior to the remaining voltages. In FIG. 11, the abscissa represents time T, and the ordinate represents voltage V.

Unlike the description given with reference to FIG. 4, the prepulses VGP, VSP, VDP1, and VDP2 for the selection transistors GST and SST and the dummy memory cells DMC1 and DMC2 may be applied before the selection read voltage Vread_s and the pass read voltage Vread_p are applied to word lines.

Figure 12:
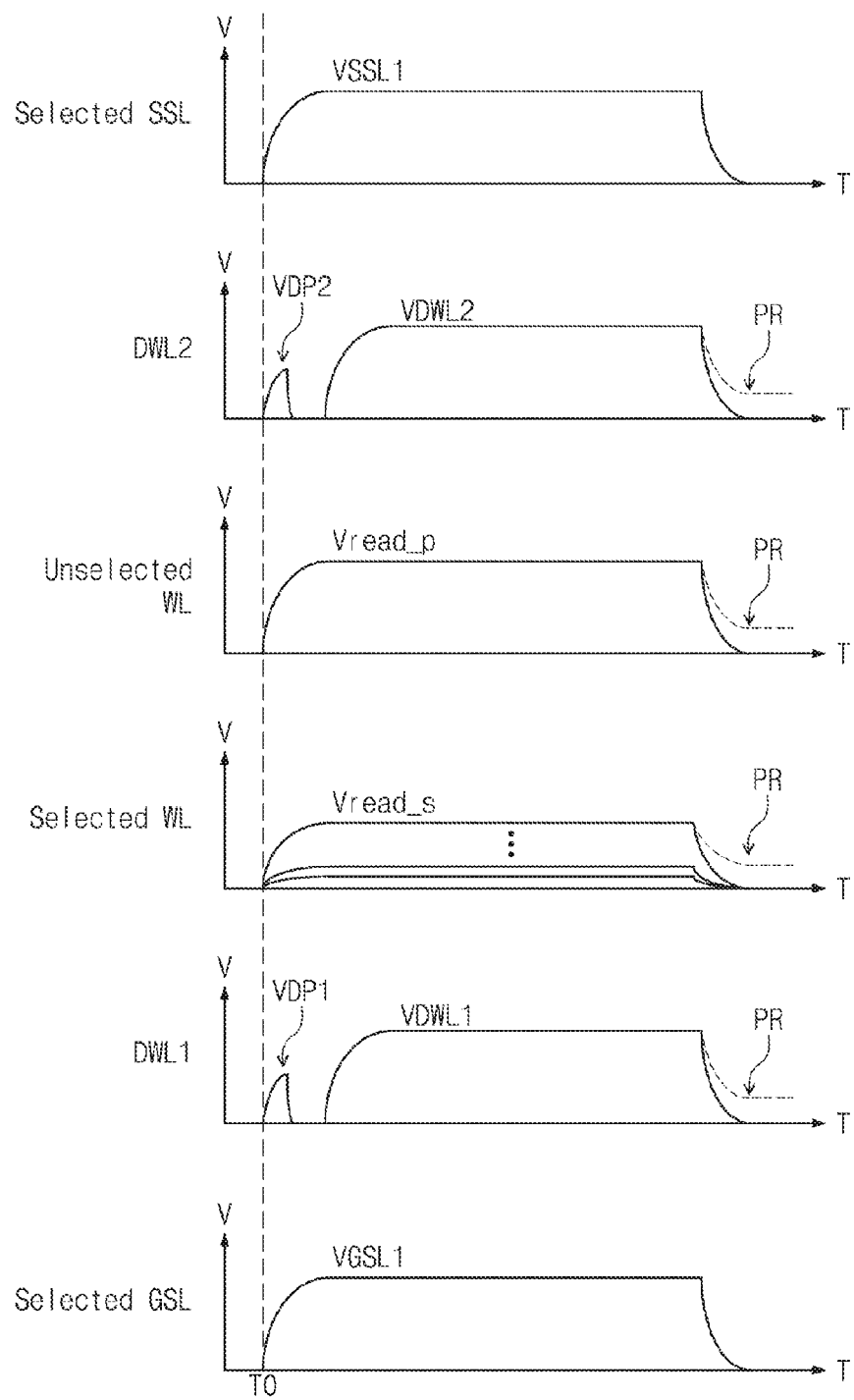
FIG. 12 illustrates an example of waveforms of voltages that are applied to selected cell strings of the memory block.

FIG. 12 illustrates an example of waveforms of voltages that are applied to selected cell strings of the memory block BLKa. In FIG. 12, the abscissa represents a time T, and the ordinate represents a voltage V.

Referring to FIGS. 1 to 3 and 12, the pass read voltage Vread_p is applied to unselected word lines WL1 to WL3 and WL5 to WL8 (operation S110), and the selection read voltage Vread_s is applied to a selected word line WL4 (operation S120).

The selection transistors GST and SSL are tuned on by applying turn-on voltages VGSL1 and VSSL1 for turning on the selection transistors GST and SST to selected selection lines GSL and SSL (operation S130).

After the first and second dummy word line prepulses VDP1 and VDP2 are applied to the dummy word lines DWL1 and DWL2, the dummy memory cells DMC1 and DMC2 are turned on by respectively applying the dummy word line voltages VDWL1 and VDWL2 for turning on the dummy memory cells DMC1 and DMC2 to the dummy word lines DWL1 and DWL2 (operation S150).

In an embodiment, a positive voltage may be charged on the bit lines BL1 to BL4 after the prepulses VGP, VSP, VDP1, and VDP2 are applied and then the selection transistors GST and SST of unselected cell strings are turned off. If memory cells connected to the selected word line WL4 are turned on, the bit lines BL1 to BL4 and the common source line CSL are electrically connected to each other, and thus voltages of the bit lines BL1 to BL4 are discharged to a ground voltage or a low voltage similar to the ground voltage. If the memory cells connected to the selected word line WL4 are turned off, the bit lines BL1 to BL4 and the common source line CSL are not electrically connected to each other, and thus the voltages of the bit lines BL1 to BL4 maintain a charge voltage. Page buffer circuit 115 may read threshold voltages of the memory cells, that is, data based on changes of voltages charged on the bit lines BL1 to BL4.

Figure 13:
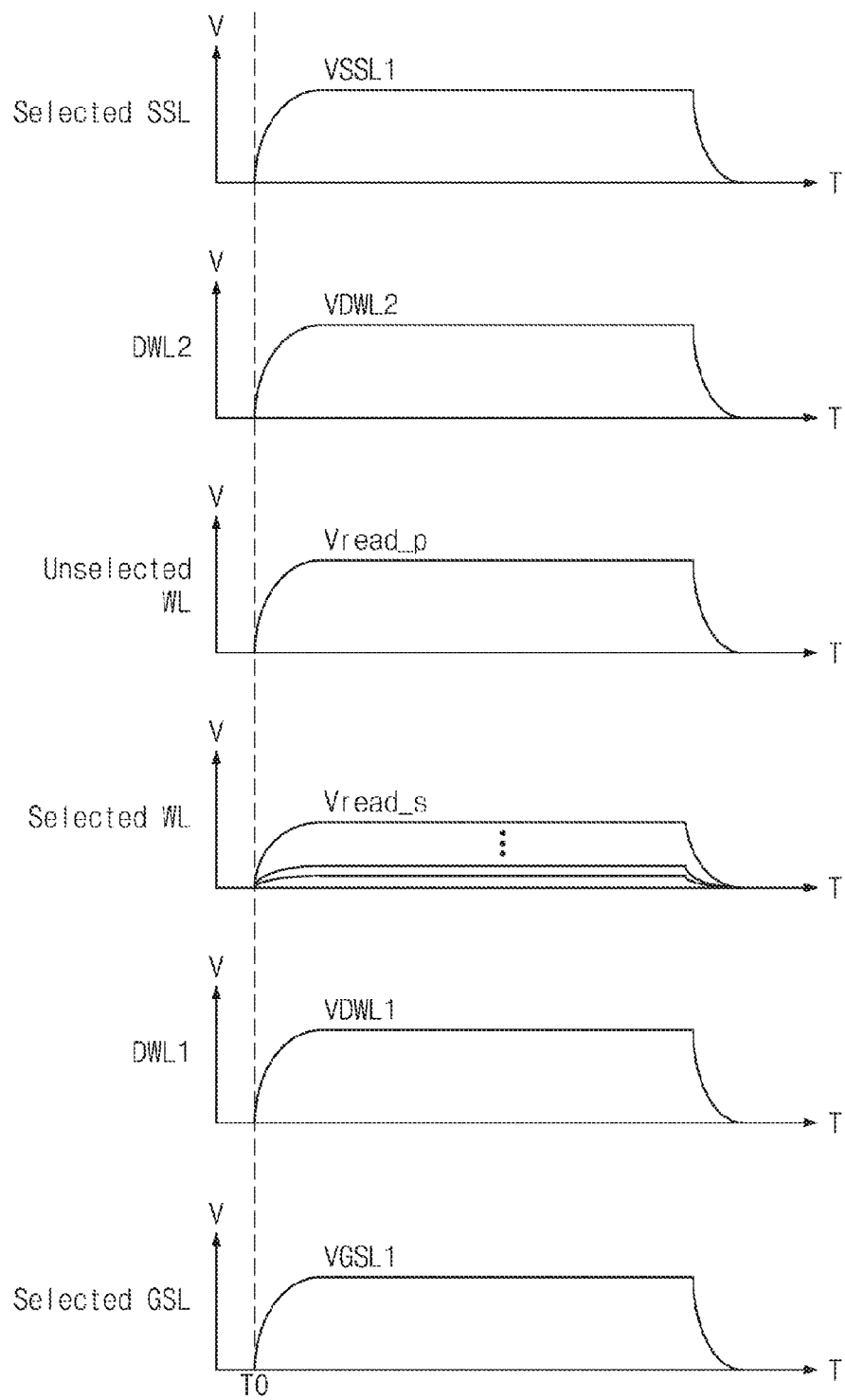
FIG. 13 illustrates an example of waveforms of voltages applied to selected cell strings of a selected memory block during a read operation that does not use the prepulse.

FIG. 13 illustrates an example of waveforms of voltages applied to selected cell strings of a selected memory block during a read operation that does not use the prepulse VGP, VSP, VDP1, or VDP2. In FIG. 13, the abscissa represents time T, and the ordinate represents voltage V.

Unlike the description given with reference to FIG. 11, no GSL and SSL prepulses VGP and VSP may be applied to the selection transistors GST and SST, and the turn-on voltages VGSL1 and VSSL1 are applied to selected selection lines GSL and SSL from T0. Also, the positive recovery PR may not be used. However, it may be possible to apply the positive recovery PR to a read operation of FIG. 13.

Figure 14:
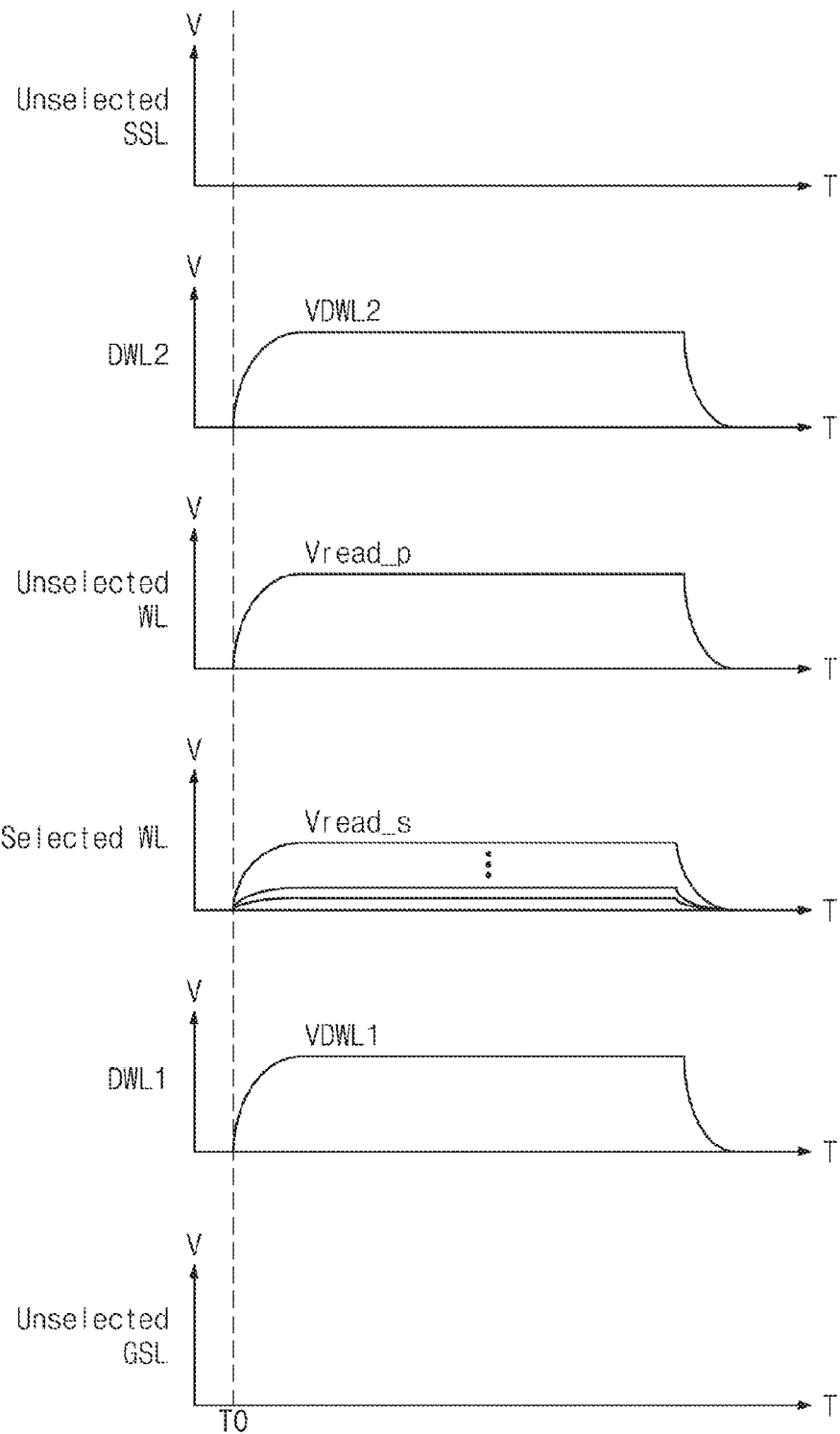
FIG. 14 illustrates an example of waveforms of voltages applied to unselected cell strings of a selected memory block during a read operation that does not use the prepulse.

FIG. 14 illustrates an example of waveforms of voltages applied to unselected cell strings of a selected memory block during a read operation that does not use the prepulse VGP, VSP, VDP1, or VDP2. In FIG. 14, the abscissa represents a time T, and the ordinate represents a voltage V.

Unlike the description given with reference to FIG. 4, no GSL and SSL prepulses VGP and VSP are applied to the selection transistors GST and SST, and the selection transistors GST and SST may be turned off from T0. Also, the first and second dummy word line prepulses VDP1 and VDP2 may not be applied to the dummy memory cells DMC1 and DMC2, the first and second dummy word line voltages DWL1 and DWL2 may be respectively applied to the dummy word lines DWL1 and DWL2 from T0. Also, the positive recovery PR may not be used. However, it may be possible to apply the positive recovery PR to a read operation of FIG. 14.

The read operation described with reference to FIGS. 3 to 14 may be also applied to a program verification read operation. For example, a program operation may include a program and a program verification. The program may include increasing threshold voltages of selected memory cells by applying a program voltage to a selected word line. The program verification may include a program verification read and a pass-fail check. The program verification read may be the same as the read operation described with reference to FIGS. 3 to 14 except that a program verification voltage is applied to the selected word line. The pass-fail check may include determining pass or fail of the program operation based on the program verification read result. If the read operation described with reference to FIGS. 3 to 14 is applied to the program verification read, the stress applied to memory cells during the program operation may be prevented (may be reduced), and the integrity of data written in memory cells may be improved.

Figure 15:
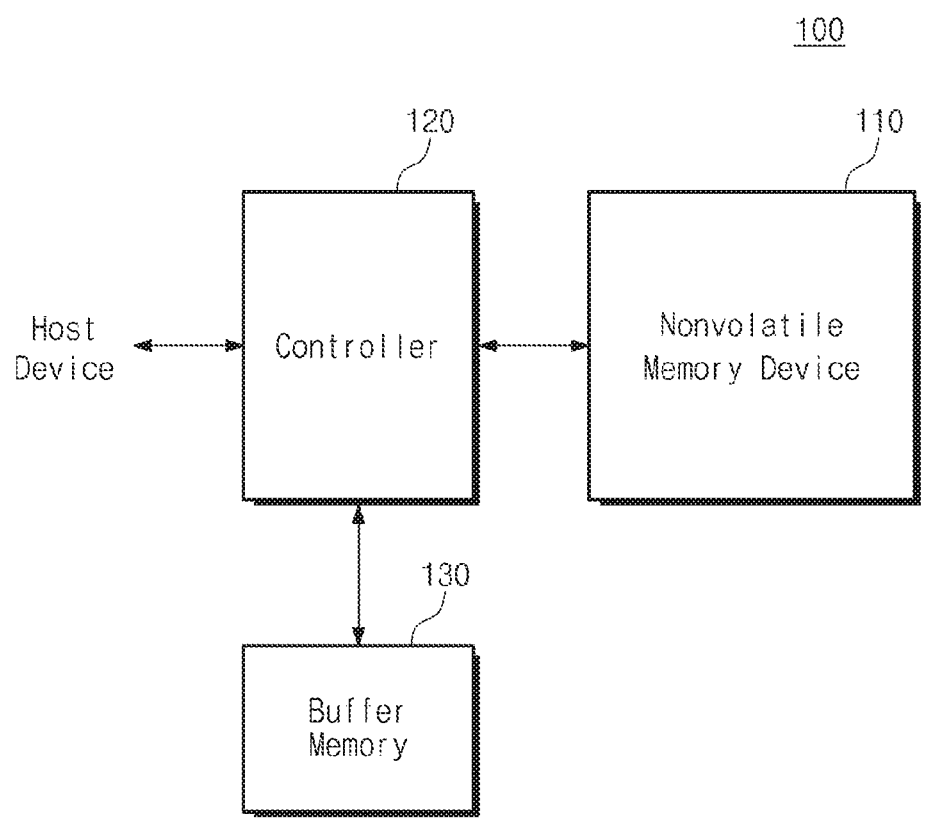
FIG. 15 is a block diagram illustrating a storage device according to an embodiment of the inventive concept.

FIG. 15 is a block diagram illustrating a storage device 100 according to an embodiment of the inventive concept. Referring to FIG. 15, storage device 100 includes nonvolatile memory device 110, controller 120, and a buffer memory 130.

Nonvolatile memory device 110 may perform a write operation, a read operation, and an erase operation under control of controller 120. As described with reference to FIGS. 1 to 14, nonvolatile memory device 110 may apply the prepulse to selection lines and dummy word lines to perform a read operation. Also, nonvolatile memory device 110 may perform one of a mode, in which a read operation is performed using the prepulse under control of controller 120, and a mode in which a read operation is performed without using the prepulse.

Nonvolatile memory device 110 may include a flash memory, a phase change random access memory (PRAM), a ferroelectric RAM (FeRAM), a magnetic RAM (MRAM), a resistive RAM (RRAM), etc.

Controller 120 may access nonvolatile memory device 110 and buffer memory 130. Controller 120 may perform a write operation, a read operation, and an erase operation in response to a request of an external host device (not illustrated). Controller 120 may write write-requested data in nonvolatile memory device 110 and may read and output read-requested data from nonvolatile memory device 110.

Controller 120 may manage storage device 100 by using buffer memory 130. For example, controller 120 may temporarily store data to be written in nonvolatile memory device 110 or data read from nonvolatile memory device 110 in buffer memory 130. Controller 120 may load metadata, which is needed to manage nonvolatile memory device 110, on buffer memory 130.

Controller 120 may control nonvolatile memory device 110 such that nonvolatile memory device 110 performs one of a read operation that uses the prepulse and a read operation that does not use the prepulse, based on settings of a host device or environments of storage device 100. For example, at power-on, when a mode is switched, or when a read command is sent to nonvolatile memory device 110, controller 120 may provide nonvolatile memory device 110 with information indicating a mode of a read operation. For example, mode information may be sent together with a read command or may be sent while included in the read command.

In an embodiment, storage device 100 may not include buffer memory 130. In the case where storage device 100 does not include buffer memory 130, all or some of functions of buffer memory 130 may be performed using an internal memory of controller 120 or a memory of the host device.

Figure 16:
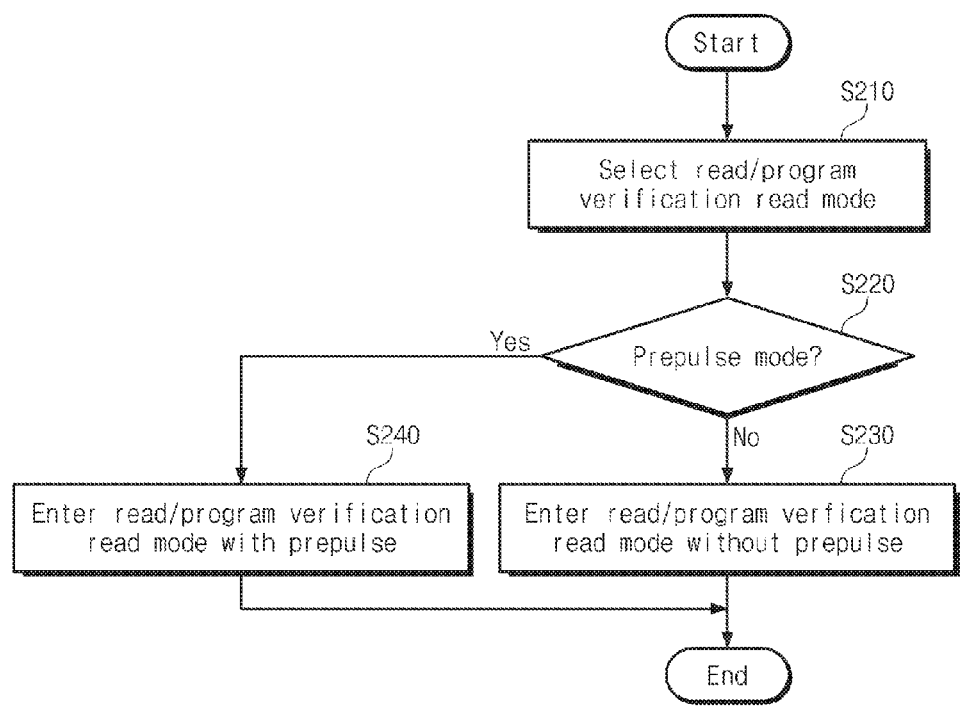
FIG. 16 is a flowchart illustrating an example in which the storage device selects a read operation or program verification read mode.

FIG. 16 is a flowchart illustrating an example in which storage device 100 selects a read operation or program verification read mode. Referring to FIGS. 15 and 16, in operation S210, controller 120 may select read operation or program verification read mode of nonvolatile memory device 110. For example, controller 120 may determine whether the read operation or program verification read mode is changed according to a request of a host device. In the case where information for requesting to enter the read operation or program verification read mode in which the prepulse is used is received from the host, controller 120 may select the read operation or program verification read mode in which the prepulse is used. In the case where information for requesting to enter the read operation or program verification read mode in which the prepulse is not used is received from the host, controller 120 may select the read operation or program verification read mode in which the prepulse is not used.

As another example, controller 120 may select the read operation or program verification read mode based on a target of a read operation or a program operation. For example, when a read count is not less than a reference frequency, when the number of bits stored in each of selected memory cells of a selected memory block is not less than a threshold value, and when a selected word line is close to a common source line or a bit line, controller 120 may select the read operation or program verification read mode in which the prepulse is used. For example, when a read count is smaller than the reference frequency, when the number of bits stored in each of selected memory cells of a selected memory block is smaller than the threshold value, and when a selected word line is located at a centric point between the common source line or the bit line, controller 120 may select the read operation or program verification read mode in which the prepulse is not used.

If a mode selected in operation S220 is the read operation or program verification read mode in which the prepulse is not used, in operation S230, controller 120 may control nonvolatile memory device 110 to enter the read operation or program verification read mode in which the prepulse is not used.

If the mode selected in operation S220 is the read operation or program verification read mode in which the prepulse is used, in operation S240, controller 120 may control nonvolatile memory device 110 to enter the read operation or program verification read mode in which the prepulse is used.

In an embodiment, in the read operation or program verification read mode were the prepulse is not used, a program verification read may be performed using the same voltages as illustrated in FIGS. 13 and 14, except that not the selection read voltage Vread_s but a program verification voltage is applied to a selected word line. In a program verification read mode where the prepulse is used, the program verification read may be performed using the same voltages as illustrated in FIGS. 4 and 12, except that instead of the selection read voltage Vread_s, the program verification voltage is applied to a selected word line.

According to embodiments of the inventive concept, channel voltages of unselected cell strings may be more finely adjusted to similar levels during a read operation. Accordingly, it may be possible to prevent threshold voltages of memory cells in unselected cell strings from being changed due to the read operation, and a nonvolatile memory device with improved reliability, a storage device including the nonvolatile memory device, and a reading method of the nonvolatile memory device may be provided.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A nonvolatile memory device, comprising:
at least one memory block, including at least a first memory block comprising a plurality of cell strings arranged in rows and columns stacked perpendicular to a substrate, wherein the cell strings include: string select transistors (SSTs) connected to string select lines (SSLs), ground select transistors (GSTs) connected to ground select lines (GSLs), a plurality of nonvolatile memory cells connected to word lines, and first and second dummy memory cells connected to first and second dummy word lines; and a row decoder circuit configured to apply voltage waveforms to the SSLs, GSLs, word lines, and first and second dummy word lines during a data read operation, including:
applying a string line select voltage to a selected SSL for selected cell strings to turn on the SSTs of the selected cell strings,
applying a ground line select voltage to a selected GSL for selected cell strings to turn on the GSTs of the selected cell strings,
applying a read pass voltage to unselected word lines of unselected nonvolatile memory cells to turn on the unselected nonvolatile memory cells of the selected cell strings,
applying a read select voltage to a selected word line of selected nonvolatile memory cells to read data from the selected nonvolatile memory cells,
applying a SSL prepulse to SSLs of unselected cell strings, and then applying an unselected SSL voltage to turn off the SSTs of the unselected cell strings;
applying a GSL prepulse to GSLs of unselected cell strings, and then applying an unselected GSL voltage to turn off the GSTs of the unselected cell strings;
applying a first dummy word line prepulse to the first dummy word line such that the first dummy memory cells are turned on and then turned off, and subsequently applying a first dummy word line voltage to the first dummy word line to turn on the first dummy cells again; and
applying a second dummy word line prepulse to the second dummy word line such that the second dummy memory cells are turned on and then turned off, and subsequently applying a second dummy word line voltage to the second dummy word line to turn on the second dummy cells again.

2. The nonvolatile memory device of claim 1, wherein the first dummy word line prepulse and second dummy word line prepulse are applied such that the first and second dummy cells are turned off at approximately a same time as each other.

3. The nonvolatile memory device of claim 2, wherein the first dummy word line prepulse and second dummy word line prepulse are applied prior to an end of the SSL prepulse and an end of the GSL prepulse.

4. The nonvolatile memory device of claim 1, wherein the first dummy memory cell is disposed adjacent to the GST and the second dummy memory cell is disposed adjacent to the SST.

5. The nonvolatile memory device of claim 4, further comprising:
a voltage generator;
a first dummy word line pass transistor connected between the voltage generator and the first dummy word line to apply the first dummy word line prepulse to the first dummy word line in response to a first dummy word line pass transistor control pulse applied to a control terminal of the first dummy word line pass transistor; and
a second dummy word line pass transistor connected between the voltage generator and the second dummy word line to apply the second dummy word line prepulse to the second dummy word line in response to a second dummy word line pass transistor control pulse applied to a control terminal of the second dummy word line pass transistor, wherein a duration of the second dummy word line pass transistor control pulse is less than a duration of the first dummy word line pass transistor control pulse.

6. The nonvolatile memory device of claim 5, wherein the second dummy word line pass transistor control pulse ends prior to a time when the first dummy word line pass transistor control pulse ends, and wherein a recovery time of the second dummy word line prepulse is greater than a recovery time of the first dummy word line prepulse.

7. The nonvolatile memory device of claim 6, wherein the first dummy word line pass transistor control pulse and the second dummy word line pass transistor control pulse start at approximately a same time as each other.

8. The nonvolatile memory device of claim 6, wherein the recovery time of the second dummy word line prepulse decreases as temperature increases.

9. The nonvolatile memory device of claim 6, wherein a magnitude of the second dummy word line prepulse decreases as temperature increases.

10. The nonvolatile memory device of claim 6, wherein the recovery time of the second dummy word line prepulse increases as the read pass voltage increases.

11. The nonvolatile memory device of claim 6, wherein a magnitude of the second dummy word line prepulse increases as the read pass voltage increases.

12. The nonvolatile memory device of claim 5, wherein at least one of the cell strings comprises a pillar that extends in a direction perpendicular to the substrate, wherein a diameter of the pillar is greater at an end furthest from the substrate than at an end closest to the substrate.

13. The nonvolatile memory device of claim 1, wherein the first dummy word line voltage is less than the unselected SSL voltage which in turn is less than or equal to the unselected GSL voltage which is in turn less than or equal to the read pass voltage.

14. The nonvolatile memory device of claim 1, wherein a duration of the first dummy word line prepulse and a duration of the second dummy word line prepulse are each less than a duration of the SSL and a duration of the GSL prepulse.

15. A nonvolatile memory device, comprising:
at least one memory block, including at least a first memory block comprising a plurality of cell strings arranged in rows and columns stacked perpendicular to a substrate, wherein the cell strings include: SSTs connected to string select lines (SSLs), ground select transistors (GSTs) connected to ground select lines (GSLs), a plurality of nonvolatile memory cells connected to word lines, and first and second dummy memory cells connected to first and second dummy word lines; and
a row decoder circuit configured to apply voltage waveforms to the SSLs, GSLs, word lines, and first and second dummy word line during a data read operation, including:
applying a string line select voltage to a selected SSL for selected cell strings to turn on the SSTs of the selected cell strings,
applying a ground line select voltage to a selected GSL for selected cell strings to turn on the GSTs of the selected cell strings,
applying a read pass voltage to unselected word lines of unselected nonvolatile memory cells to turn on the unselected nonvolatile memory cells of the selected cell strings,
applying a read select voltage to a selected word line of selected nonvolatile memory cells to read data from the selected nonvolatile memory cells,
applying a SSL prepulse to SSLs of unselected cell strings, and then applying an unselected SSL voltage to turn off the SSTs of the unselected cell strings;
applying a GSL prepulse to GSLs of unselected cell strings, and then applying an unselected GSL voltage to turn off the GSTs of the unselected cell strings;
applying a first dummy word line prepulse to the first dummy word line such that the first dummy memory cells are turned on and then turned off, and subsequently applying a first dummy word line voltage to the first dummy word line to turn on the first dummy cells again; and
applying a second dummy word line prepulse to the second dummy word line such that the second dummy memory cells are turned on and then turned off, and subsequently applying a first dummy word line voltage to the first dummy word line to turn on the first dummy cells again,
wherein the row decoder circuit is further configured to apply positive recovery voltages to the word lines and first and second dummy word lines at an end of the data read operation.

16. A method of performing a data operation for a nonvolatile memory device comprising: at least one memory block, the memory block comprising a plurality of cell strings arranged in rows and columns stacked perpendicular to a substrate, wherein the cell strings include: string select transistors (SSTs) connected to string select lines (SSLs), ground select transistors (GSTs) connected to ground select lines (GSLs), a plurality of nonvolatile memory cells connected to word lines, and first and second dummy memory cells connected to first and second dummy word lines, the method comprising:
applying a string line select voltage to a selected SSL for selected cell strings to turn on the SSTs of the selected cell strings;
applying a ground line select voltage to a selected GSL for selected cell strings to turn on the GSTs of the selected cell strings;
applying a read pass voltage to unselected word lines of unselected nonvolatile memory cells to turn on the unselected nonvolatile memory cells of the selected cell strings;
applying a read select voltage to a selected word line of selected nonvolatile memory cells to read data from the selected nonvolatile memory cells;
applying a SSL prepulse to SSLs of unselected cell strings, and then applying an unselected SSL voltage to turn off the SSTs of the unselected cell strings;
applying a GSL prepulse to GSLs of unselected cell strings, and then applying an unselected GSL voltage to turn off the GSTs of the unselected cell strings;
applying a first dummy word line prepulse to the first dummy word line such that the first dummy memory cells are turned on, then turned off, and subsequently applying a first dummy word line voltage to the first dummy word line to turn on the first dummy cells again; and
applying a second dummy word line prepulse to the second dummy word line such that the second dummy memory cells are turned on and then turned off, and subsequently applying a first dummy word line voltage to the first dummy word line to turn on the first dummy cells again.

17. The method of claim 16, wherein the first dummy word line prepulse and second dummy word line prepulse are applied such that the first and second dummy cells are turned off at approximately a same time as each other.

18. The method of claim 17, wherein the first dummy word line prepulse and second dummy word line prepulse are applied prior to an end of the SSL prepulse and an end of the GSL prepulse.

19. The method of claim 17, wherein the first dummy memory cell is disposed adjacent to the GST and the second dummy memory cell is disposed adjacent to the SST, and wherein the nonvolatile memory device further comprises: a voltage generator; a first dummy word line pass transistor connected between the voltage generator and the first dummy word line; and a second dummy word line pass transistor connected between the voltage generator and the second dummy word line, the method further comprising:

applying a first dummy word line pass transistor control pulse to a control terminal of the first dummy word line pass transistor to apply the first dummy word line prepulse to the first dummy word line; and applying a second dummy word line pass transistor control pulse to a control terminal of the second dummy word line pass transistor to apply the second dummy word line prepulse to the second dummy word line, wherein a duration of the second dummy word line pass transistor control pulse is less than a duration of the first dummy word line pass transistor control pulse.

20. The method of claim 19, further comprising ending the second dummy word line pass transistor control pulse prior ending the first dummy word line pass transistor control pulse, and wherein a recovery time of the second dummy word line prepulse is greater than a recovery time of the first dummy word line prepulse.

\* \* \* \* \*